(12) United States Patent
Mizoguchi et al.

(10) Patent No.: US 8,679,986 B2
(45) Date of Patent: Mar. 25, 2014

(54) METHOD FOR MANUFACTURING DISPLAY DEVICE

(75) Inventors: Takafumi Mizoguchi, Atsugi (JP); Kojiro Shiraishi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 112 days.

(21) Appl. No.: 13/244,387

(22) Filed: Sep. 24, 2011

(65) Prior Publication Data

US 2012/0094433 A1 Apr. 19, 2012

(30) Foreign Application Priority Data

Oct. 14, 2010 (JP) ................................. 2010-231372

(51) Int. Cl.
*H01L 21/302* (2006.01)

(52) U.S. Cl.
USPC ............................................ 438/739; 438/39

(58) Field of Classification Search
USPC ........................................ 438/39–40, 42–43
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,143,640 A * | 11/2000 | Cronin et al. | 438/618 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters ) , Sep. 27, 2004, vol. 85, No. 13, pp. 2541-2543.

(Continued)

*Primary Examiner* — Allen Parker
(74) *Attorney, Agent, or Firm* — Eric J. Robinson; Robinson Intellectual Property Law Office, P.C.

(57) ABSTRACT

Provided is a method for manufacturing a semiconductor device so as not expose a semiconductor layer to moisture and the number of masks is reduced. For example, a first conductive film, a first insulating film, a semiconductor film, a second conductive film, and a mask film are formed. The first mask film is processed to form a first mask layer. Dry etching is performed on the first insulating film, the semiconductor film, and the second conductive film with the use of the first mask layer to form a thin film stack body, so that a surface of the first conductive film is at least exposed. Sidewall insulating layers covering side surfaces of the thin film stack body are formed. The first conductive film is side-etched to form a first electrode. A second electrode layer is formed with the second mask layer.

16 Claims, 17 Drawing Sheets

(56) References Cited

U.S. PATENT DOCUMENTS

| | | | |
|---|---|---|---|
| 7,211,825 B2 | 5/2007 | Shih et al |
| 7,215,388 B2 | 5/2007 | Fukuhara |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,749,820 B2 | 7/2010 | Miyairi |
| 7,993,991 B2 | 8/2011 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0212296 A1* | 8/2009 | Mizoguchi et al. ............ 257/71 |
| 2009/0224249 A1 | 9/2009 | Miyairi et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0187535 A1 | 7/2010 | Suzawa et al. |
| 2010/0193772 A1 | 8/2010 | Morosawa et al. |
| 2010/0193784 A1 | 8/2010 | Morosawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-055660 | 3/2005 |
| JP | 2009-158941 | 7/2009 |
| JP | 2009-239272 | 10/2009 |
| JP | 2009-239276 | 10/2009 |
| JP | 2010-182818 | 8/2010 |
| JP | 2010-182819 | 8/2010 |
| JP | 2010-199570 | 9/2010 |
| WO | WO-2004/114391 | 12/2004 |
| WO | 2009/072451 | 6/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appls. Phys. Lett. (Applied Physics Letters ) , Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters ) , Jun. 17, 1996, vol. 68, No. 25, pp. 3650-3652.

(56) References Cited

OTHER PUBLICATIONS

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics ) , Feb. 1, 2003, vol. 93, No. 3, pp. 1624-1630.

Asakuma.N et al., "Crystallization and Reduction of SOL-GEL-Derived Zinc Oxide Films by Irradiation With Ultraviolet Lamp,", Journal of SOL-GEL Science and Technology, 2003, vol. 26, pp. 181-184..

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters ) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem Oleds,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:AL and SN-DOPED Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties, SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007 , vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu, or Zn] at temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics ) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appls. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

METHOD FOR MANUFACTURING DISPLAY DEVICE

BACKGROUND OF THE INVENTION

1. Field of the Invention

The present invention relates to a semiconductor device and a manufacturing method thereof. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as a liquid crystal display device.

2. Description of the Related Art

In recent years, semiconductor devices are indispensable to human life. Semiconductor elements, such as thin film transistors, included in semiconductor devices are manufactured in such a manner that a thin film such as a semiconductor film is formed over a substrate and the thin film is processed into a desired shape by a photolithography method or the like. Such a manufacturing method is used for manufacturing an active matrix liquid crystal display device (e.g., a liquid crystal television).

A semiconductor device typified by an active matrix liquid crystal display device is generally manufactured by a photolithography method. In a photolithography method, it is required to reduce the number of photomasks in view of productivity. For example, techniques by which the number of photomasks can be reduced are disclosed in Patent Documents 1 to 4.

Meanwhile, as a material for a semiconductor layer provided for a thin film transistor, silicon is widely used. On the other hand, in recent years, a thin film transistor including an oxide semiconductor as a material for a semiconductor layer has been actively researched. However, it is known that carrier concentration is greatly changed in a thin film transistor including an oxide semiconductor when moisture enters the semiconductor layer (e.g., Patent Document 5 and Patent Document 6). It is also known that characteristics of a thin film transistor including a semiconductor other than an oxide semiconductor are changed when moisture enters the semiconductor layer (e.g., Patent Document 7).

REFERENCE

Patent Documents

[Patent Document 1] Japanese Published Patent Application No. 2009-158941
[Patent Document 2] Japanese Published Patent Application No. 2009-239272
[Patent Document 3] Japanese Published Patent Application No. 2009-239276
[Patent Document 4] Japanese Published Patent Application No. 2010-199570
[Patent Document 5] Japanese Published Patent Application No. 2010-182818
[Patent Document 6] Japanese Published Patent Application No. 2010-182819
[Patent Document 7] Japanese Published Patent Application No. 2005-055660

SUMMARY OF THE INVENTION

According to the techniques disclosed in Patent Documents 1 to 4, the number of photomasks can be reduced. However, for example, a resist mask is used for forming a source electrode and a drain electrode; therefore, the resist mask needs to be removed after forming the source electrode and the drain electrode. A resist mask is generally removed using a resist stripper, in which a layer exposed by being processed is exposed to a resist stripper. On the other hand, a resist mask can also be removed by oxygen plasma dry process; however, some of the resist might remain.

Once moisture enters a semiconductor layer, it is not easy to remove the moisture. Heat treatment performed on a semiconductor layer that moisture enters can be given as an example of a means for removing the entering moisture. However, in the case where a semiconductor layer is provided over a glass substrate, for example, the heating temperature is limited and it takes long time to complete the heat treatment, causing a decrease in throughput.

One embodiment of the present invention aims to provide a method for manufacturing a semiconductor device, in which no surface of a portion to be a semiconductor layer is exposed to moisture or the like, and the number of photomasks used in a photolithography method can be reduced. In particular, it is an object to provide a method for manufacturing a semiconductor device, in which no surface of a portion to be a semiconductor layer is exposed to a stripper in removing a resist mask, and the number of photomasks used in a photolithography method can be reduced.

One embodiment of the present invention provides a method for manufacturing a semiconductor device, in which the semiconductor device can be manufactured without exposing a portion to be a semiconductor layer to a chemical solution (e.g., a resist stripper) by sealing the portion to be a semiconductor layer, and the number of masks can be reduced.

One embodiment of the present invention is a method for manufacturing a semiconductor device, including the steps of: forming a first conductive film, a first insulating film, a semiconductor film, a second conductive film, and a mask film in this order; forming a first resist mask over the mask film; forming a first mask layer by processing the mask film with the use of the first resist mask; removing the first resist mask using a chemical solution (e.g., a resist stripper); forming a thin film stack body by performing dry etching on the first insulating film, the semiconductor film, and the second conductive film with the use of the first mask layer, so that a surface of the first conductive film is at least exposed; forming a sidewall insulating layer covering a side surface of the thin film stack body; forming a first electrode layer by performing side etching on the first conductive film; forming a second resist mask over the first mask layer over the thin film stack body (or an additional mask film over the thin film stack body, which is formed after removing the first mask layer); forming a second mask layer by processing the first mask layer or the additional mask film with the use of the second resist mask; removing the second resist mask using a chemical solution (e.g., a resist stripper); and forming a second electrode layer by processing an upper portion of the thin film stack body with the use of the second mask layer. The step of exposing the semiconductor film is performed after removing the first resist mask or the second resist mask.

Note that in this specification, a first electrode layer forms at least a gate electrode and may form a gate wiring. A second electrode layer forms a source electrode and a drain electrode and may form a source wiring.

Note that in this specification, a "film" is to be processed in a later step and is substantially uniformly formed over a surface. A "layer" is a processed film or is substantially uniformly formed over a surface and does not need to be processed in a later step.

Note that in this specification, etch-back treatment refers to an etching process in which a film formed over an entire surface is subjected to highly anisotropic etching (e.g., dry etching) until part of the surface over which the film is formed is exposed.

In the structure of one embodiment of the present invention, the first resist mask and the second resist mask may be removed in a dry process. A cleaning process is preferably performed after that process.

Alternatively, in the structure of one embodiment of the present invention, one of the first resist mask and the second resist mask may be removed using a chemical solution and the other may be removed in a dry process.

According to one embodiment of the present invention, a semiconductor device can be manufactured in such a manner that no surface of a portion to be a semiconductor layer is exposed to moisture or the like, and the number of photomasks used in a photolithography method is reduced. In particular, a semiconductor device can be manufactured in such a manner that no surface of a portion to be a semiconductor layer is exposed to a stripper in removing a resist mask and the number of photomasks used in a photolithography method is reduced.

According to one embodiment of the present invention, a semiconductor device can be manufactured in such a manner that a resist does not remain, no surface of a portion to be a semiconductor layer is exposed to moisture, and the number of photomasks used in a photolithography method is reduced.

DETAILED DESCRIPTION OF THE INVENTION

Figure 1A:
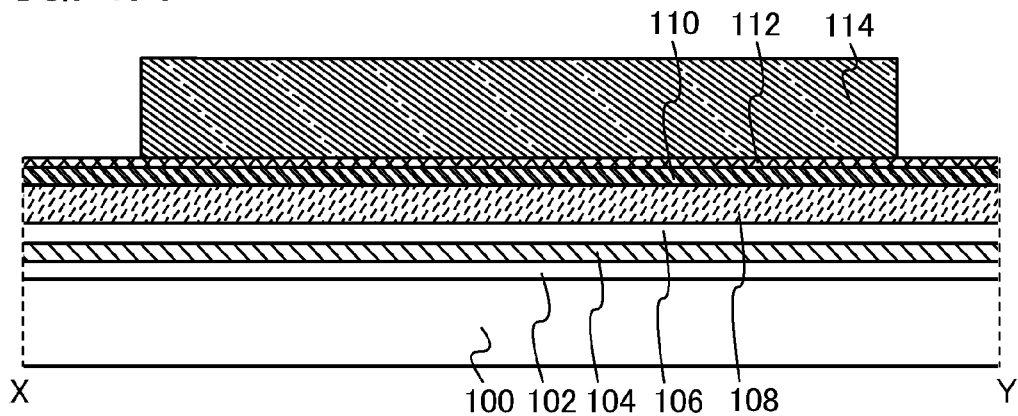
FIGS. 1A to 1D are cross-sectional views illustrating a method for manufacturing a semiconductor device that is one embodiment of the present invention.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below. Note that an insulating film and an insulating layer are not illustrated in a top view in some cases.

Embodiment 1

In this embodiment, a method for manufacturing a semiconductor device that is one embodiment of the present invention will be described with reference to drawings.

A method for manufacturing a semiconductor device of one embodiment of the present invention, which is described in this embodiment, includes the steps of: stacking a first conductive film, a first insulating film, a semiconductor film, a second conductive film, and a mask film in this order; forming a first resist mask over the mask film; forming a first mask layer by performing dry etching or wet etching on the mask film with the use of the first resist mask; removing the first resist mask using a resist stripper; forming a thin film stack body by performing dry etching on the first insulating film, the semiconductor film, and the second conductive film with the use of the first mask layer, so that a surface of the first conductive film is at least exposed; forming a second insulating film so as to cover the first mask layer and the thin film stack body; forming a sidewall insulating layer so as to cover at least the entire side surface of a semiconductor region of the thin film stack body by performing etch-back treatment on the second insulating film; forming a first electrode layer by performing wet etching or dry etching in which part of the first conductive film is side-etched; forming a second resist mask over the first mask layer; forming a second mask layer by performing dry etching or wet etching on the first mask layer with the use of the second resist mask; removing the second resist mask using a resist stripper; and forming a second electrode layer and a semiconductor layer by performing dry etching on an upper portion of the thin film stack body with the use of the second mask layer.

Alternatively, in a method for manufacturing a semiconductor device of one embodiment of the present invention, the second mask layer is not necessarily formed by processing the first mask layer. In this case, the first mask layer may be removed after formation of the thin film stack body, a second mask film may be formed after formation of the sidewall insulating layer, and a second mask layer may be formed by processing the second mask film. Accordingly, a method for manufacturing a semiconductor device of one embodiment of the present invention, which is described in this embodiment, includes the steps of: stacking a first conductive film, a first insulating film, a semiconductor film, a second conductive film, and a first mask film in this order; forming a first resist mask over the first mask film; forming a first mask layer by performing dry etching or wet etching on the first mask film with the use of the first resist mask; removing the first resist mask using a resist stripper; forming a thin film stack body by performing dry etching on the first insulating film, the semiconductor film, and the second conductive film with the use of the first mask layer, so that a surface of the first conductive film is at least exposed; removing the first mask layer by dry etching; forming a second insulating film so as to cover the thin film stack body; forming a sidewall insulating layer so as to cover at least the entire side surface of a semiconductor region of the thin film stack body by performing etch-back treatment on the second insulating film; forming a first electrode layer by performing wet etching or dry etching in which part of the first conductive film is side-etched; forming a second mask film over at least the thin film stack body; forming a second resist mask over the second mask film; forming a second mask layer by performing dry etching or wet etching on the second mask film with the use of the second resist mask; removing the second resist mask using a resist stripper; and forming a second electrode layer and a semiconductor layer by performing dry etching on an upper portion of the thin film stack body with the use of the second mask layer.

Alternatively, in a method for manufacturing a semiconductor device of one embodiment of the present invention, the first mask layer may be removed in formation of the sidewall insulating layer. Accordingly, a method for manufacturing a semiconductor device of one embodiment of the present invention, which is described in this embodiment, includes the steps of: stacking a first conductive film, a first insulating film, a semiconductor film, a second conductive film, and a first mask film in this order; forming a first resist mask over the first mask film; forming a first mask layer by performing dry etching or wet etching on the first mask film with the use of the first resist mask; removing the first resist mask using a resist stripper; forming a thin film stack body by performing dry etching on the first insulating film, the semiconductor film, and the second conductive film with the use of the first mask layer, so that a surface of the first conductive film is at least exposed; forming a second insulating film so as to cover the first mask layer and the thin film stack body; forming a sidewall insulating layer so as to cover at least the entire side surface of a semiconductor region of the thin film stack body and removing the first mask layer by performing etch-back treatment on the second insulating film; forming a first electrode layer by performing wet etching or dry etching in which part of the first conductive film is side-etched; forming a second mask film over at least the second conductive layer; forming a second resist mask over the second mask film; forming a second mask layer by performing dry etching or wet etching on the second mask film with the use of the second resist mask; removing the second resist mask using a resist stripper; and forming a second electrode layer and a semiconductor layer by performing dry etching on an upper portion of the thin film stack body with the use of the second mask layer.

Note that in the structure of the method for manufacturing a semiconductor device, the first electrode layer may be formed after formation of the second resist mask and before formation of the second mask layer. Alternatively, the first electrode layer may be formed after formation of the second mask layer and before removal of the second resist mask using a stripper. Further alternatively, the first electrode layer may be formed after removal of the second resist mask using a stripper.

Figure 6:
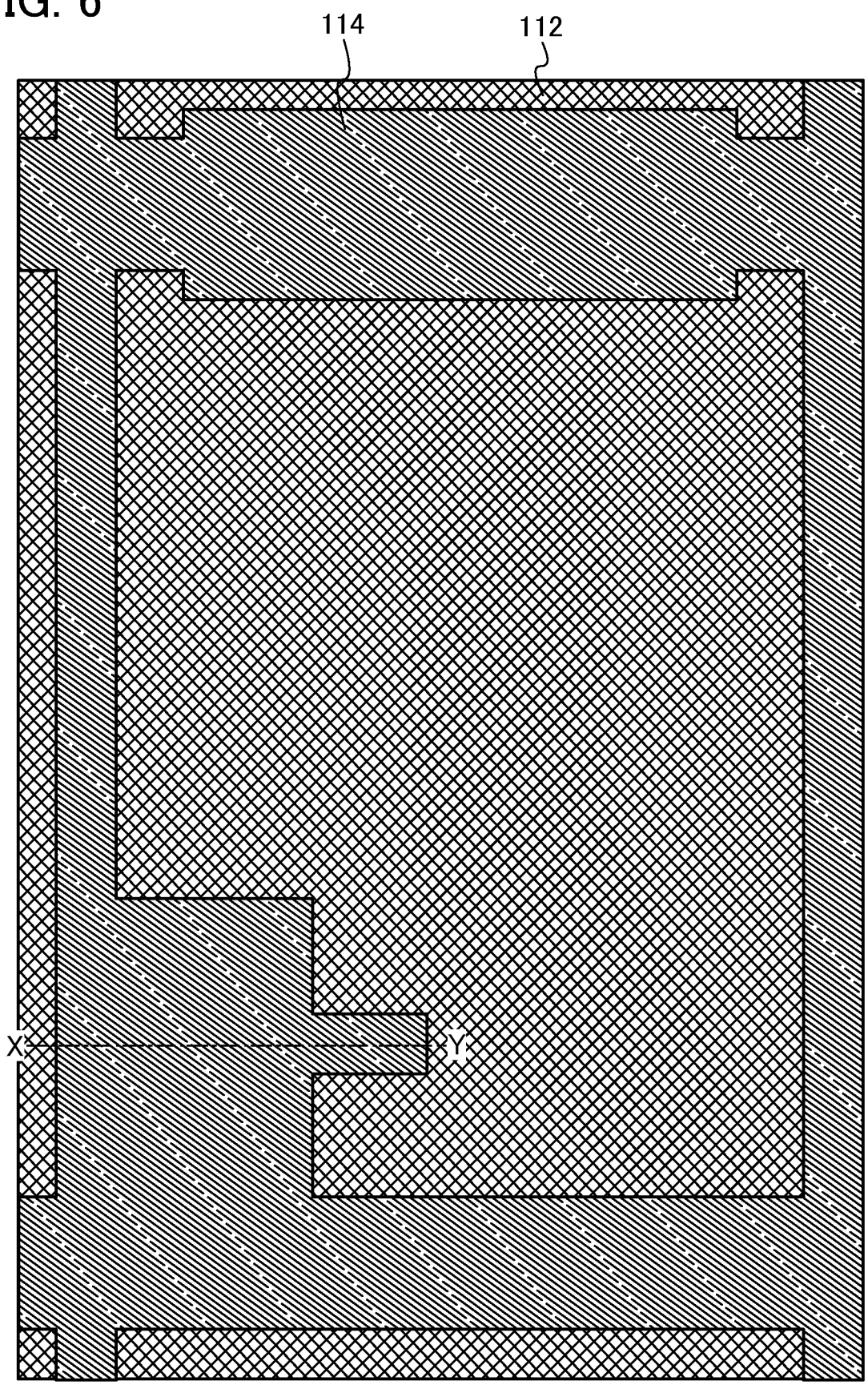
FIG. 6 is a top view illustrating a method for manufacturing a semiconductor device that is one embodiment of the present invention.

First, a base insulating layer 102, a first conductive film 104, a first insulating film 106, a semiconductor film 108, a second conductive film 110, and a mask film 112 are formed over a substrate 100. These films may each have a single-layer structure or a stacked structure including a plurality of layers. Then, a first resist mask 114 is formed over the mask film 112 (FIG. 1A and FIG. 6).

The substrate 100 is an insulating substrate. As the substrate 100, for example, a glass substrate, a quartz substrate, a ceramic substrate, or a plastic substrate or the like with heat resistance that is high enough to withstand a process temperature in this manufacturing process can be used. When the substrate 100 is a glass substrate, the substrate may have any size of the first generation (e.g., 320 mm×400 mm) to the tenth generation (e.g., 2950 mm×3400 mm); however, the substrate is not limited thereto.

The base insulating layer 102 is provided for preventing the substrate 100 from being etched and preventing an alkali metal or the like from entering a semiconductor film in the case where the substrate 100 contains the alkali metal or the like. For example, the base insulating layer 102 may be formed using silicon nitride. Note that the base insulating layer 102 is not necessarily provided.

The first conductive film 104 may be formed by a sputtering method, a CVD method (including a plasma CVD method, a thermal CVD method, and the like), or the like, for example. A metal film, a semiconductor film to which an impurity element imparting one conductivity type is added, or the like can be given as an example of a material of the first conductive film 104. Alternatively, the first conductive film 104 may be formed by an ink jet method or the like. Note that the first conductive film 104 may be formed to have either a single-layer structure or a stacked structure including a plurality of layers. For example, a three-layer structure may be employed in which an Al layer is sandwiched between Ti layers or Mo layers.

The first insulating film 106 may be formed using an insulating material (e.g., silicon nitride, silicon nitride oxide, silicon oxynitride, or silicon oxide) by a sputtering method, a CVD method (including a plasma CVD method, a thermal CVD method, and the like), or the like, for example. Note that the first insulating film 106 may be formed to have either a single-layer structure or a stacked structure including a plurality of layers.

Note that "silicon nitride oxide" contains more nitrogen than oxygen and, in the case where measurements are performed using Rutherford backscattering spectrometry (RBS) and hydrogen forward scattering (HFS), preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

"Silicon oxynitride" contains more oxygen than nitrogen and, in the case where measurements are performed using RBS and HFS, preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

The semiconductor film 108 may be any semiconductor film having either a single-layer structure or a stacked structure including a plurality of layers. An oxide semiconductor film or a silicon film can be given as an example of the semiconductor film 108.

In the case where the semiconductor film 108 is an oxide semiconductor film, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; an In—O-based oxide semiconductor, a Sn—O-based oxide semiconductor, a Zn—O-based oxide semiconductor, or the like can be used. The oxide semiconductor film may contain $SiO_2$. For example, an In—Ga—Zn—O-based oxide semiconductor film means an oxide semiconductor film containing In, Ga, or Zn, and there is no particular limitation on the stoichiometric proportion. Further, the In—Ga—Zn—O-based oxide semiconductor film may contain an element other than In, Ga, and Zn.

In the case where the semiconductor film 108 is an oxide semiconductor film, an oxide semiconductor represented by the chemical formula $InMO_3(ZnO)_m$ (m>0) can be used, for example. Here, M represents one or more metal elements selected from Ga, Al, Mn, and Co. For example, M can be Ga, Ga and Al, Ga and Mn, or Ga and Co. The oxide semiconductor film may contain silicon oxide.

A target used for formation of the oxide semiconductor film by a sputtering method is, for example, an oxide target containing $In_2O_3$, $Ga_2O_3$, and ZnO at a composition ratio of 1:1:1 [molar ratio]. Without limitation to the material and the composition of the above target, an oxide target containing $In_2O_3$, $Ga_2O_3$, and ZnO at a composition ratio of 1:1:2 [molar ratio] may be used, for example.

Here, in the case where the semiconductor film 108 is an oxide semiconductor film formed by a sputtering method, the semiconductor film 108 can be formed by a sputtering method in a rare gas (e.g., Ar) atmosphere, an oxygen atmosphere, or a mixed atmosphere including a rare gas and oxygen.

The filling rate of the oxide target is higher than or equal to 90% and lower than or equal to 100%, preferably higher than or equal to 95% and lower than or equal to 99.9%. With the use of the oxide target having a high filling rate, the oxide semiconductor film to be formed can be a dense film.

In the case where the semiconductor film 108 is an oxide semiconductor film, the first insulating film 106 which is in contact with the semiconductor film 108 may be formed using silicon oxide, sidewall insulating layers 122 to be formed later may be also formed using silicon oxide, and heat treatment may be performed under such a condition that the oxide semiconductor film can be dehydrated or dehydrogenated. Even in the case where heat treatment is performed in such a manner, the heat treatment can be performed in a shorter time as compared to a conventional heat treatment because the oxide semiconductor film is not exposed to moisture.

Alternatively, a silicon film may be used as the semiconductor film 108. As the silicon film, an amorphous silicon film may be used. Alternatively, a stacked silicon film in which a silicon film with low carrier mobility is formed over a silicon film with high carrier mobility may be used.

As the silicon film with high carrier mobility, a crystalline silicon film can be given. As crystalline silicon, microcrystalline silicon can be given, for example. Here, microcrystalline silicon is silicon having an intermediate structure between an amorphous structure and a crystalline structure (including a single crystal structure and a polycrystalline structure). Microcrystalline silicon is silicon having a third state that is stable in terms of free energy and is crystalline silicon having short-range order and lattice distortion, in which column-like or needle-like crystal grains having a diameter greater than or equal to 2 nm and less than or equal to 200 nm, preferably greater than or equal to 10 nm and less than or equal to 80 nm, more preferably greater than or equal to 20 nm and less than or equal to 50 nm grow in a direction normal to the substrate surface. Thus, there is a case where crystal grain boundaries are formed at the interface of the column-like or needle-like crystal grains. Note that the crystal grain size here means a maximum diameter of a crystal grain in a plane parallel to the substrate surface. Further, the crystal grain includes an amorphous silicon region and a crystallite which is a minute crystal that can be regarded as a single crystal. The crystal grain may include a twin crystal.

Microcrystalline silicon has a peak of Raman spectrum which is shifted to a lower wave number side than 520 $cm^{-1}$ that represents single crystal silicon. That is, the peak of the Raman spectrum of microcrystalline silicon is within the range from 520 $cm^{-1}$ which represents single crystal silicon, to 480 $cm^{-1}$ which represents amorphous silicon. The microcrystalline silicon may contain hydrogen or halogen of at least 1 at. % to terminate dangling bonds. Moreover, microcrystalline silicon contains a rare gas element such as He, Ar, Kr, or Ne to further promote lattice distortion, so that stability is increased and favorable microcrystalline silicon can be obtained.

As the silicon film with low carrier mobility, an amorphous silicon film may be used. A silicon film including amorphous silicon and a minute silicon crystal grain, which has lower energy at the Urbach edge, which is measured by a constant photocurrent method (CPM) or photoluminescence spectrometry, and a smaller quantity of absorption spectra of defects, as compared to a conventional amorphous silicon film, is preferably used. As compared to the conventional amorphous silicon film, such a silicon film is a well-ordered silicon film which has few defects and a steep tail slope of a level at a band edge (a mobility edge) in the valence band.

The silicon film with low carrier mobility may contain halogen or nitrogen. In the case of containing nitrogen, nitrogen may exist as an NH group or an $NH_2$ group.

Note that here, an interface region between the silicon film with high carrier mobility and the silicon film with low carrier mobility includes microcrystalline semiconductor regions and amorphous semiconductor regions filling a space between the microcrystalline semiconductor regions. Specifically, the interface region between the silicon film with high carrier mobility and the silicon film with low carrier mobility includes a microcrystalline semiconductor region which extends in a conical or pyramidal shape from the silicon film with high carrier mobility and a "region including an amorphous semiconductor" which is similar to the silicon film with low carrier mobility.

When the silicon film with low carrier mobility is provided between the source and drain electrodes and the silicon film with high carrier mobility, off-state current of the transistor can be reduced. Further, since the interface region has the microcrystalline silicon region which extends in a conical or pyramidal shape, resistance in the vertical direction (the direction in which the film grows) can be lowered and on-state current of the transistor can be increased. In other words, as compared to the case of using conventional amorphous silicon, the off-state current can be sufficiently reduced and reduction in on-state current can be suppressed; thus, switching characteristics of the transistor can be improved.

Note that the microcrystalline silicon region grows from a surface of the silicon film with high carrier mobility in the film thickness direction. When the flow rate of hydrogen with respect to that of a deposition gas (e.g., silane) in a source gas is low (that is, the dilution ratio is low) or when the concentration of a source gas containing nitrogen is high, crystal growth in the microcrystalline silicon region is suppressed, and thus, crystal grains come to have a conical or pyramidal shape, and a large portion of the deposited silicon is amorphous.

The second conductive film 110 may be formed by a sputtering method, a CVD method (including a plasma CVD method, a thermal CVD method, and the like), or the like, for example. Alternatively, the second conductive film 110 may be formed by an ink jet method. Note that the second conductive film 110 may have a single-layer structure or a stacked structure including a plurality of layers. For example, a two-layer structure in which an Al film is formed over a Ti film may be employed.

The mask film 112 may be formed using a material which is not (is not easily) etched in a first etching process and a third etching process performed later. As the mask film 112, for example, an insulating film such as a silicon oxide film or a silicon nitride film can be used. Alternatively, as the mask film 112, a metal film can be used, for example. In the case where a metal film is used, the metal film can be used as part of an electrode layer.

The first resist mask 114 is formed in such a manner that a resist material is applied or the like over the mask film 112 and then processed by a photolithography method.

Figure 1B:
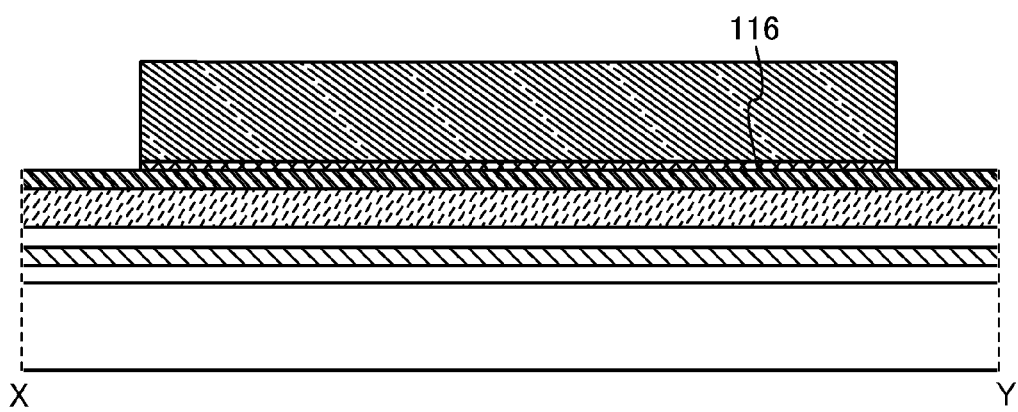

Next, the mask film 112 is subjected to dry etching or wet etching with the use of the first resist mask 114 to form a first mask layer 116 (FIG. 1B). In this embodiment, this process is referred to as the first etching process.

Here, the first etching process may be performed under such conditions that the etching rate of the second conductive film 110 is low and the etching rate of the mask film 112 is high. In other words, the first etching process may be performed under such conditions that the etching selectivity of the mask film 112 with respect to the second conductive film 110 is high.

Figure 1C:
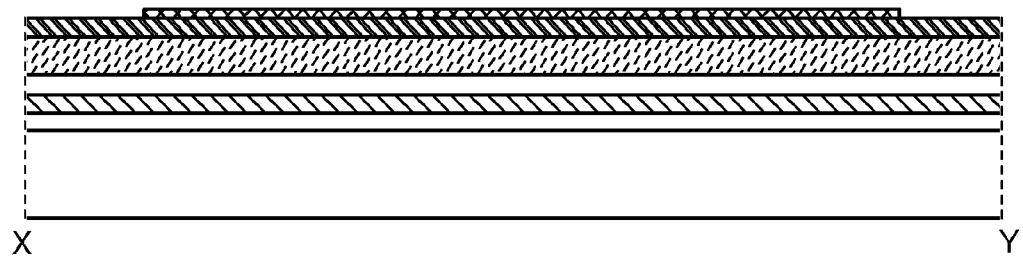
Figure 7:
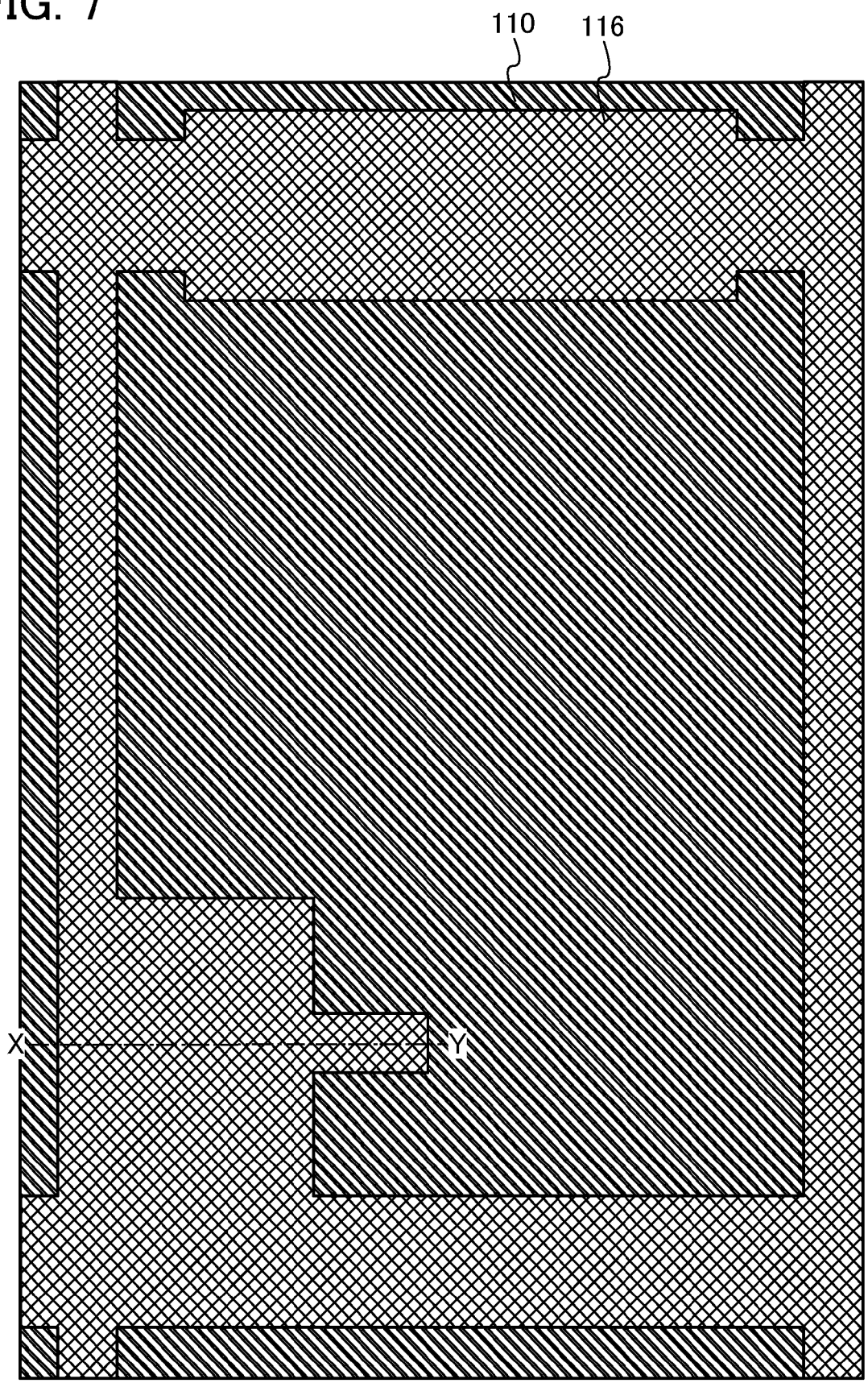
FIG. 7 is a top view illustrating a method for manufacturing a semiconductor device that is one embodiment of the present invention.

Next, the first resist mask 114 is removed using a resist stripper (FIG. 1C and FIG. 7).

Figure 1D:
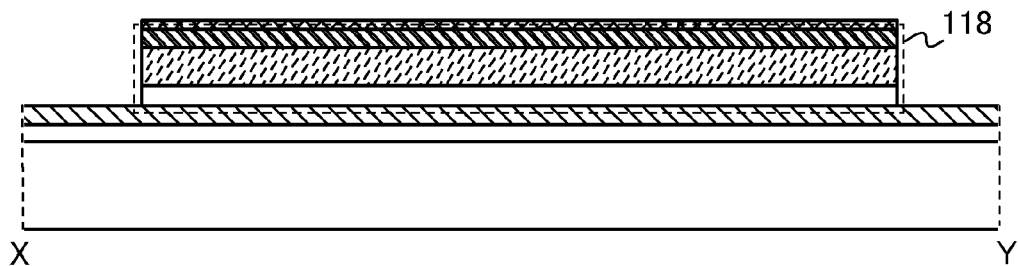
Figure 8:
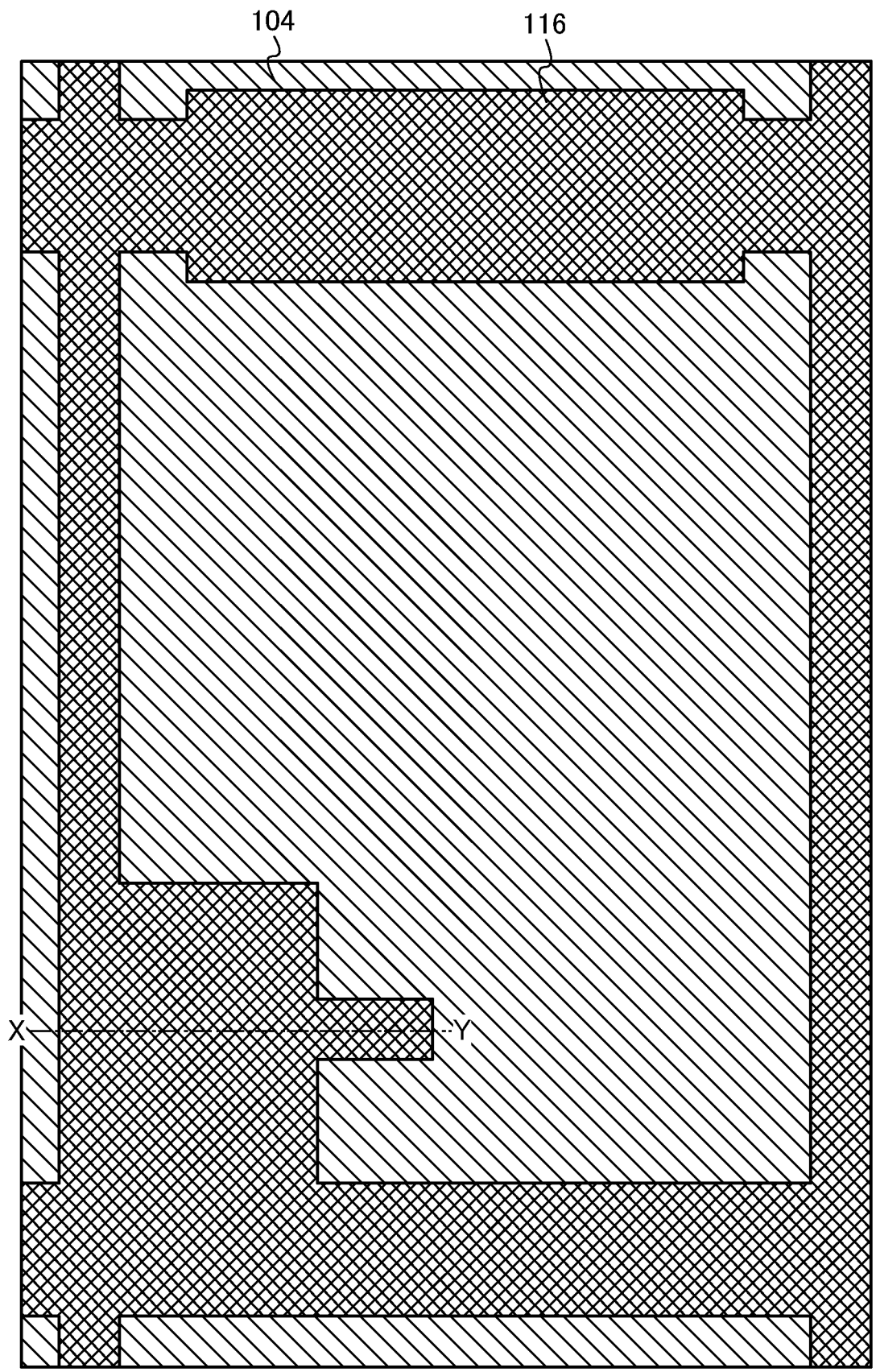
FIG. 8 is a top view illustrating a method for manufacturing a semiconductor device that is one embodiment of the present invention.

Next, the second conductive film 110, and the semiconductor film 108, and the first insulating film 106 are subjected to dry etching with the use of the first mask layer 116 to form a thin film stack body 118 (FIG. 1D and FIG. 8). In this embodiment, this process is referred to as a second etching process.

Here, the second etching process may be performed under such conditions that the etching rate of the first mask layer 116 is low and the etching rates of the second conductive film 110, the semiconductor film 108, and the first insulating film 106 are high. In other words, the second etching process may be performed under such conditions that the etching selectivity of the second conductive film 110, the semiconductor film 108, and the first insulating film 106 with respect to the first mask layer 116 is high. Note that the second etching process preferably includes a plurality of steps (e.g., two or three steps) because plural kinds of films are etched.

For example, the second etching process may be performed by a first step in which etching is performed with the use of a mixed gas of a $Cl_2$ gas, a $CF_4$ gas, and an $O_2$ gas, a second step in which etching is performed with the use of a $Cl_2$ gas, and a third step in which etching is performed with the use of a $CHF_3$ gas.

Here, the first mask layer 116 may be removed. A method by which a semiconductor region of the thin film stack body 118 is not exposed to moisture (e.g., dry etching treatment) is applied to the removal of the first mask layer 116.

Figure 2A:
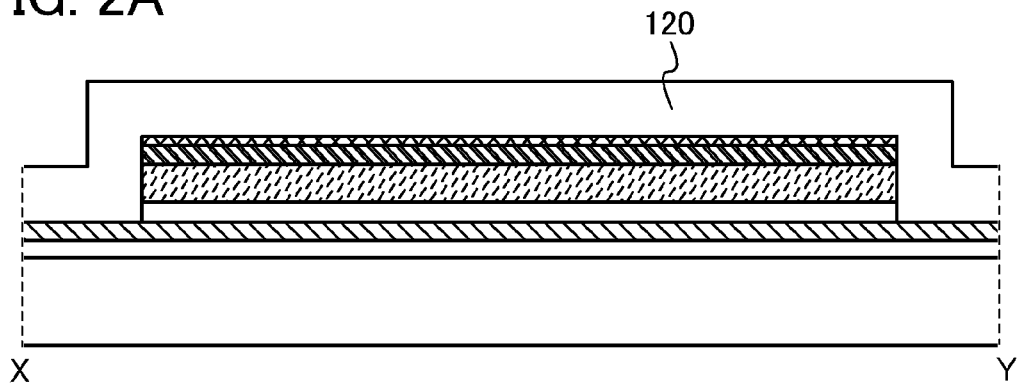
FIGS. 2A to 2D are cross-sectional views illustrating a method for manufacturing a semiconductor device that is one embodiment of the present invention.

Next, a sidewall insulating film 120 which covers the thin film stack body 118 is formed by a sputtering method, a CVD method (including a plasma CVD method, a thermal CVD method, and the like), or the like (FIG. 2A).

Note that the sidewall insulating film 120 is preferably formed using the same material as that of the first insulating film 106. This is in order that adhesion between the thin film stack body 118 and sidewall insulating layers 122 to be formed later is increased.

Alternatively, heat treatment may be performed after formation of the sidewall insulating film 120. This is in order that adhesion between the thin film stack body 118 and the sidewall insulating layers 122 to be formed later is increased.

Figure 2B:
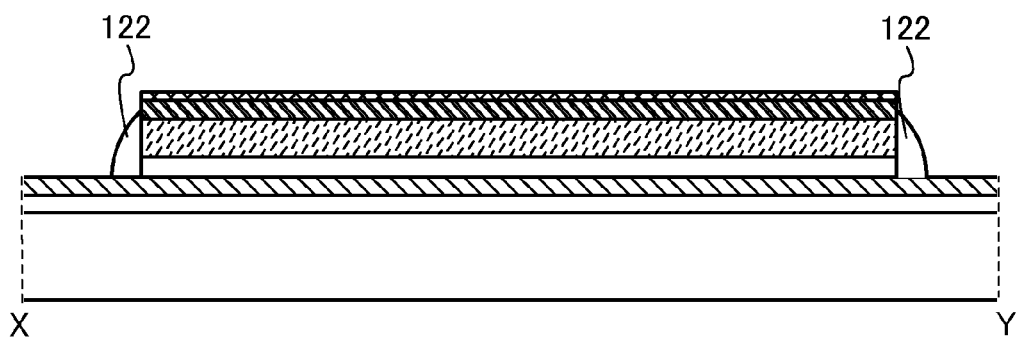

Next, the sidewall insulating film 120 is subjected to etch-back treatment to form the sidewall insulating layers 122 so as to cover at least the entire side surfaces of the semiconductor region of the thin film stack body 118 (FIG. 2B). Here, the etch-back treatment is performed until the first mask layer 116 or a conductive region of the thin film stack body 118 is exposed.

Figure 2C:
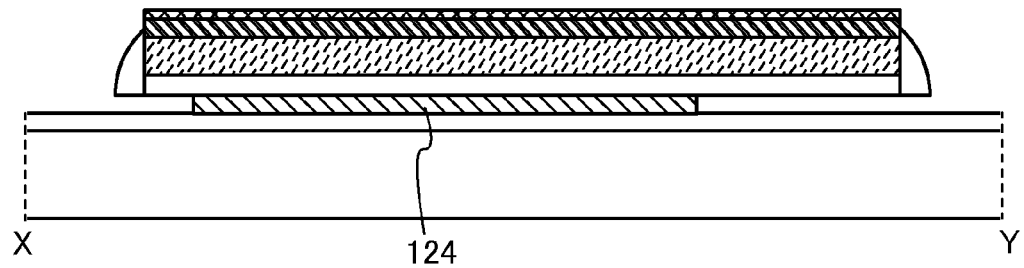
Figure 9:
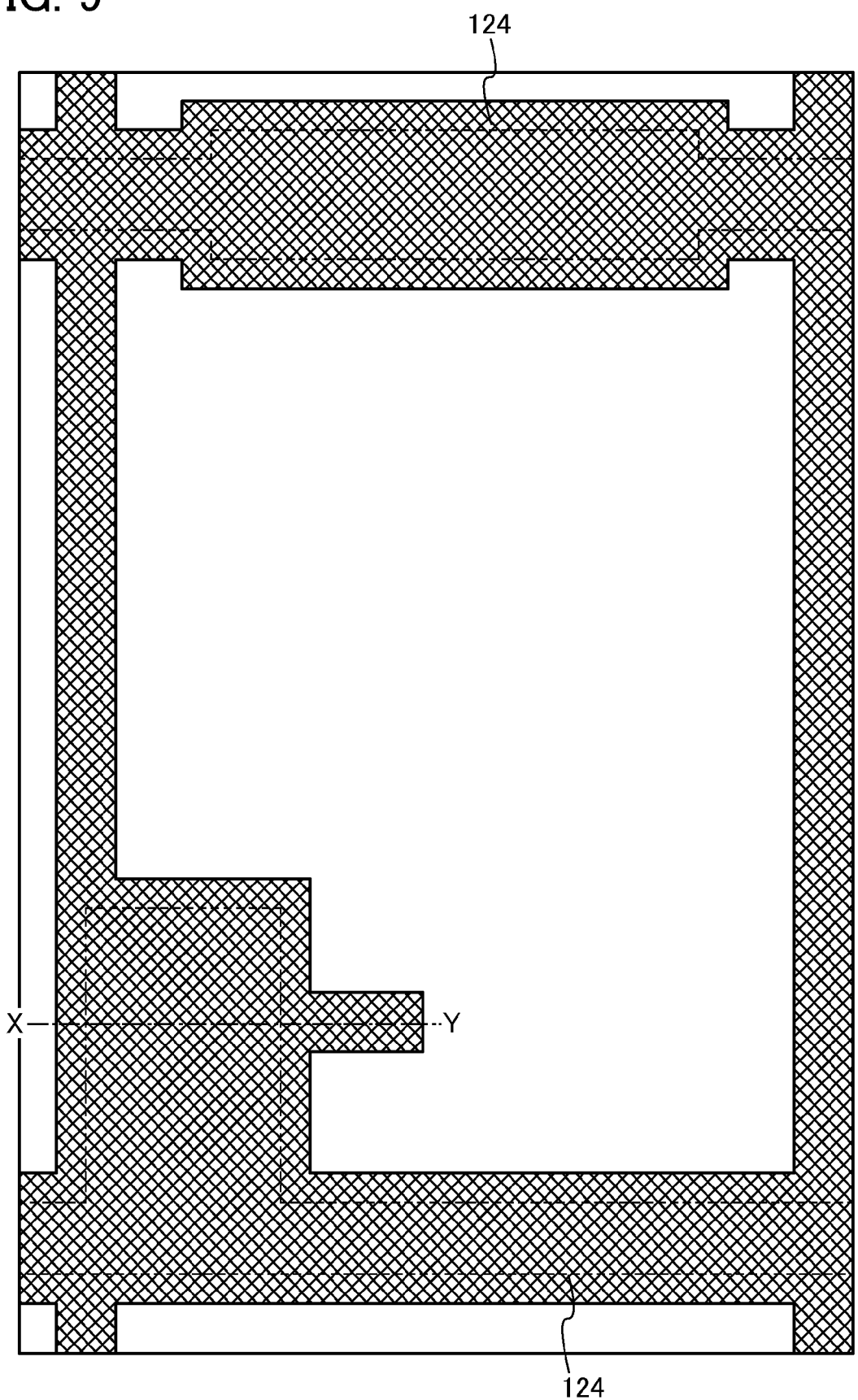
FIG. 9 is a top view illustrating a method for manufacturing a semiconductor device that is one embodiment of the present invention.

Next, wet etching or dry etching in which part of the first conductive film 104 is side-etched is performed to form a first electrode layer 124 (FIG. 2C and FIG. 9).

In the etching process for forming the first electrode layer 124, the first conductive film 104 needs to be side-etched while the base insulating layer 102 and the sidewall insulating layers 122 are not etched and, in the case where the conductive region of the thin film stack body 118 (the region formed of the second conductive film 110) is exposed, the region is not etched. Accordingly, for example, an Al film or a Mo film may be formed as the first conductive film 104, a Ti film or a W film may be formed as the second conductive film 110, and a chemical solution containing nitric acid, acetic acid, and phosphoric acid may be used as an etchant. Alternatively, a Mo film may be formed as the first conductive film 104, a Ti film, an Al film, or a W film may be formed as the second conductive film 110, and a chemical solution containing hydrogen peroxide may be used as an etchant.

Figure 2D:
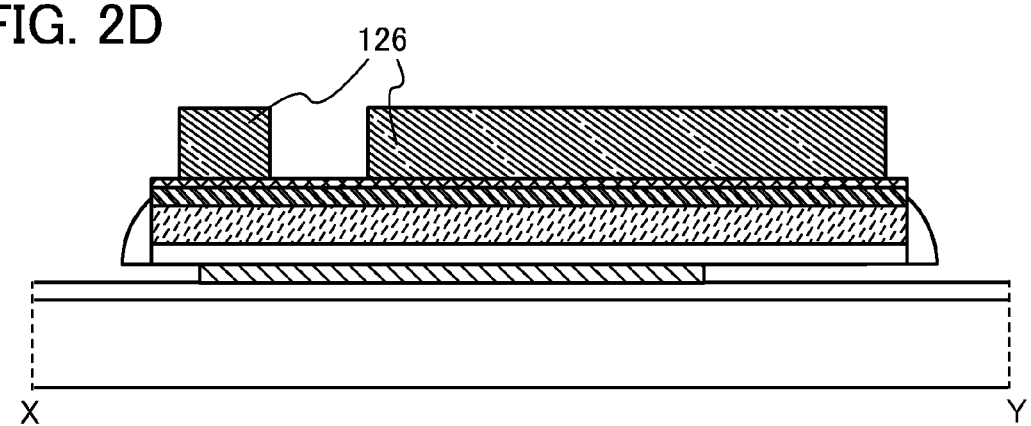
Figure 10:
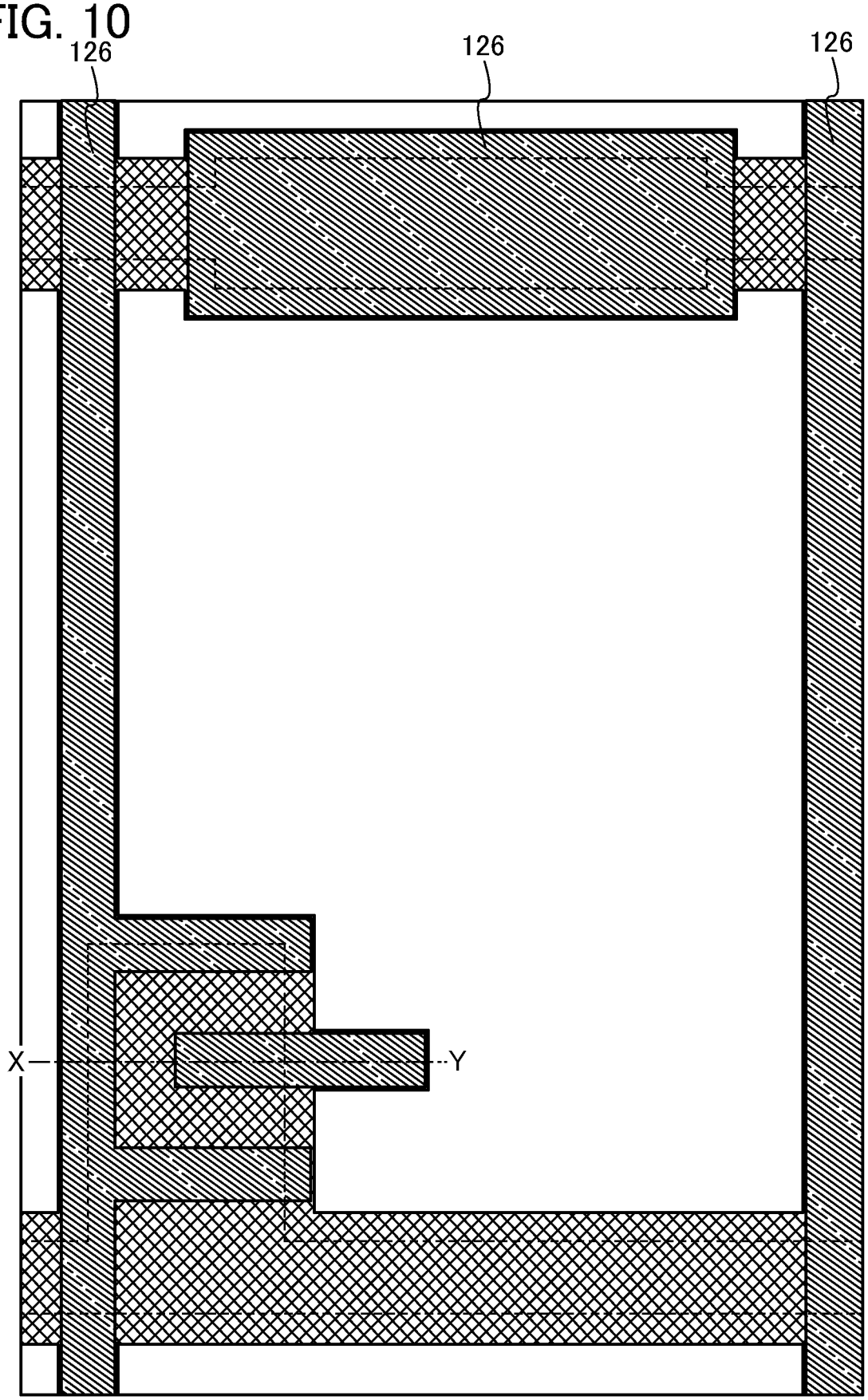
FIG. 10 is a top view illustrating a method for manufacturing a semiconductor device that is one embodiment of the present invention.

Next, a second resist mask 126 is formed over the first mask layer 116 (FIG. 2D and FIG. 10).

The second resist mask 126 is formed in such a manner that a resist material is applied or the like over the first mask layer 116 and then processed by a photolithography method.

In the case where the first mask layer 116 is removed through the steps up to here, a second mask film (not illustrated) is formed over at least the thin film stack body 118 and the second resist mask 126 is formed over the second mask film.

Figure 3A:
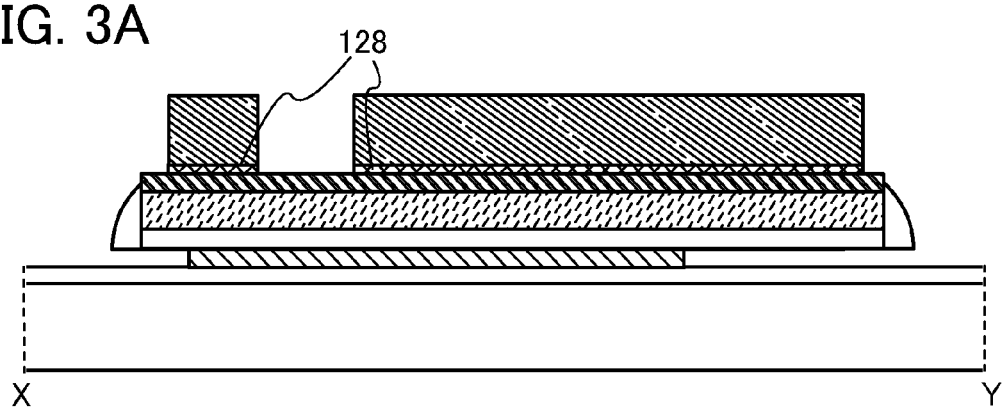
FIGS. 3A to 3D are cross-sectional views illustrating a method for manufacturing a semiconductor device that is one embodiment of the present invention.
Figure 11:
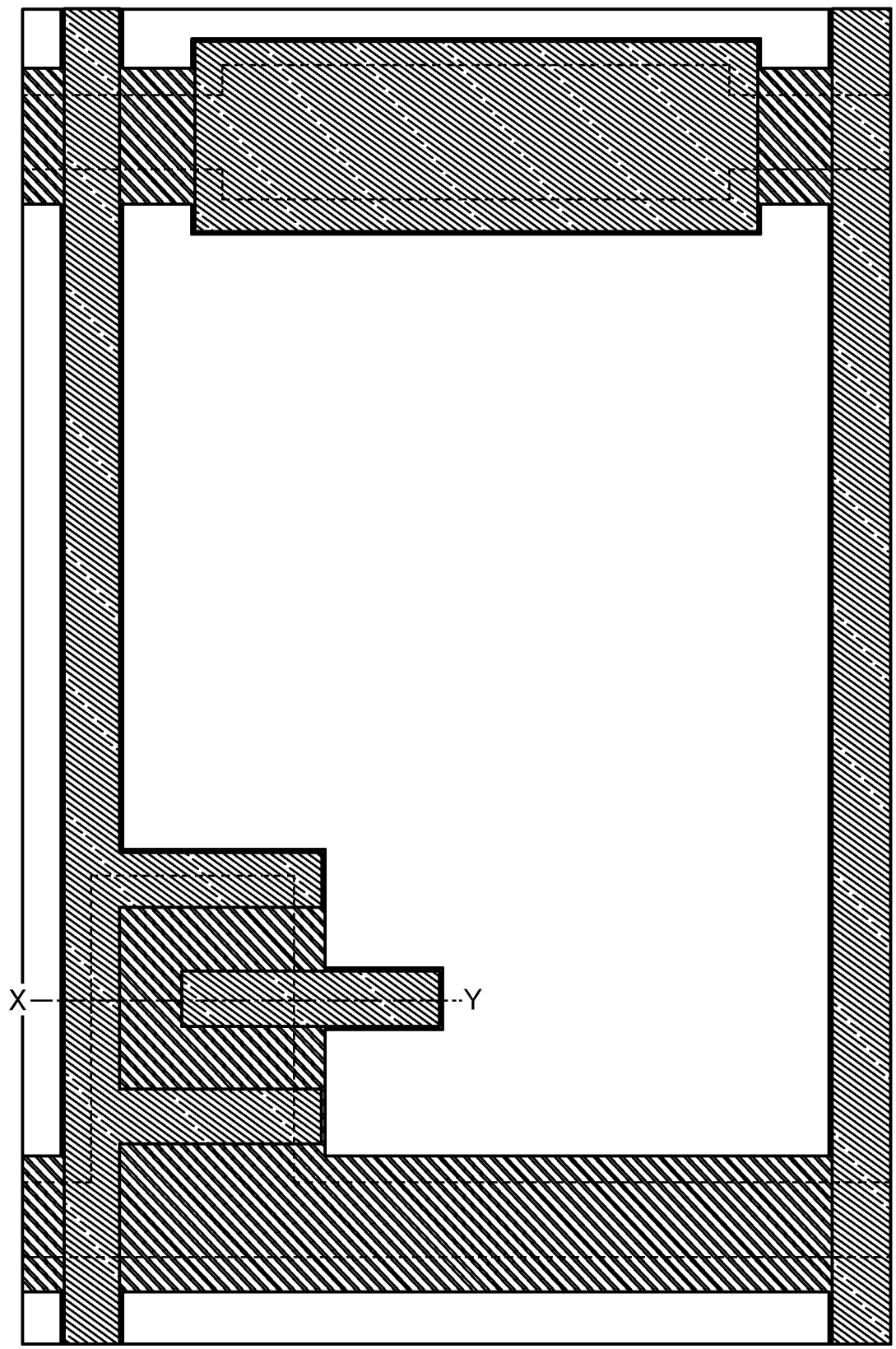
FIG. 11 is a top view illustrating a method for manufacturing a semiconductor device that is one embodiment of the present invention.

Next, the first mask layer 116 or the second mask film (not illustrated) is subjected to dry etching or wet etching with the use of the second resist mask 126 to form a second mask layer 128. In this embodiment, this process is referred to as the third etching process (FIG. 3A and FIG. 11).

Here, the third etching process may be performed under such conditions that the etching rates of at least the second conductive film 110, the sidewall insulating layers 122, and the first insulating film 106 are low and the etching rate of the mask film 112 is high. In other words, the third etching process may be performed under such conditions that the etching selectivity of the mask film 112 with respect to the second conductive film 110, the sidewall insulating layers 122, and the first insulating film 106 is high.

Figure 3B:
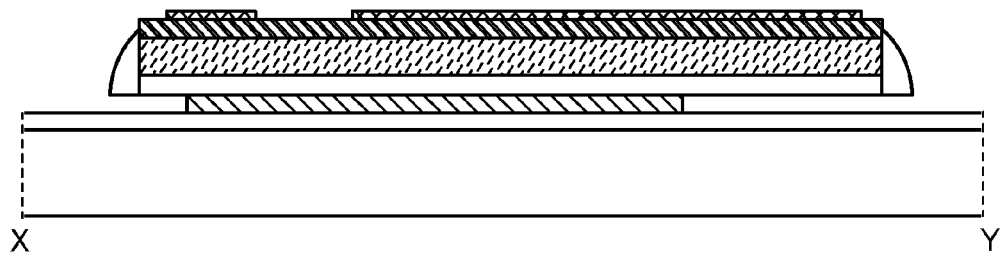
Figure 12:
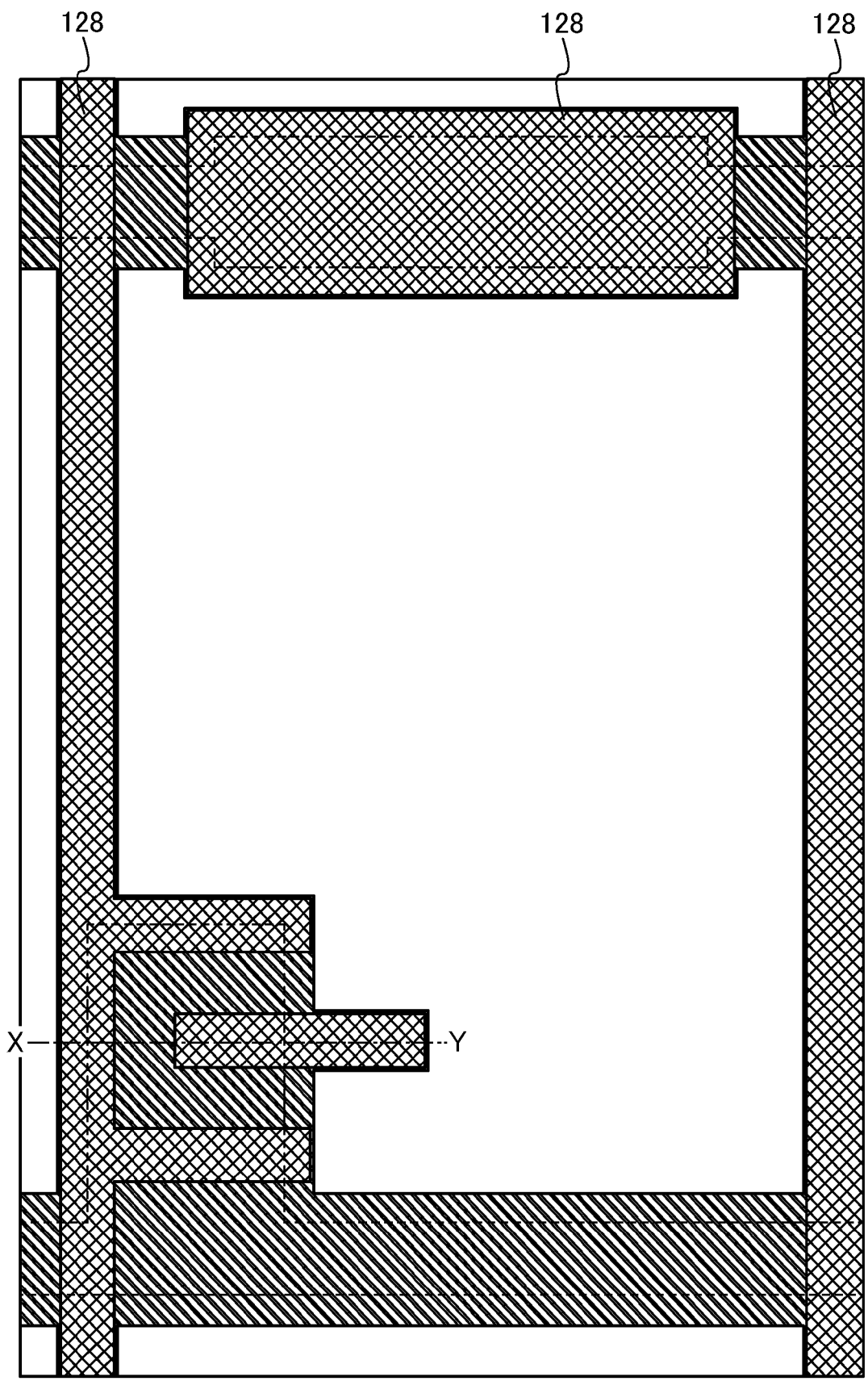
FIG. 12 is a top view illustrating a method for manufacturing a semiconductor device that is one embodiment of the present invention.

Next, the second resist mask 126 is removed using a resist stripper (FIG. 3B and FIG. 12).

Figure 3C:
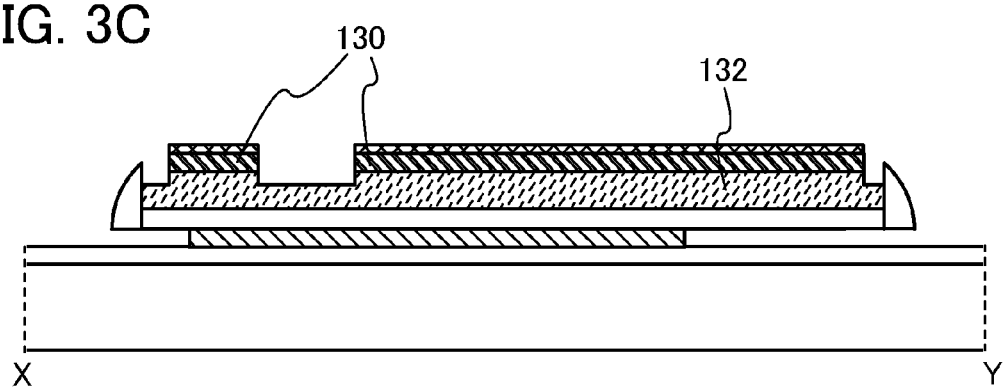
Figure 13:
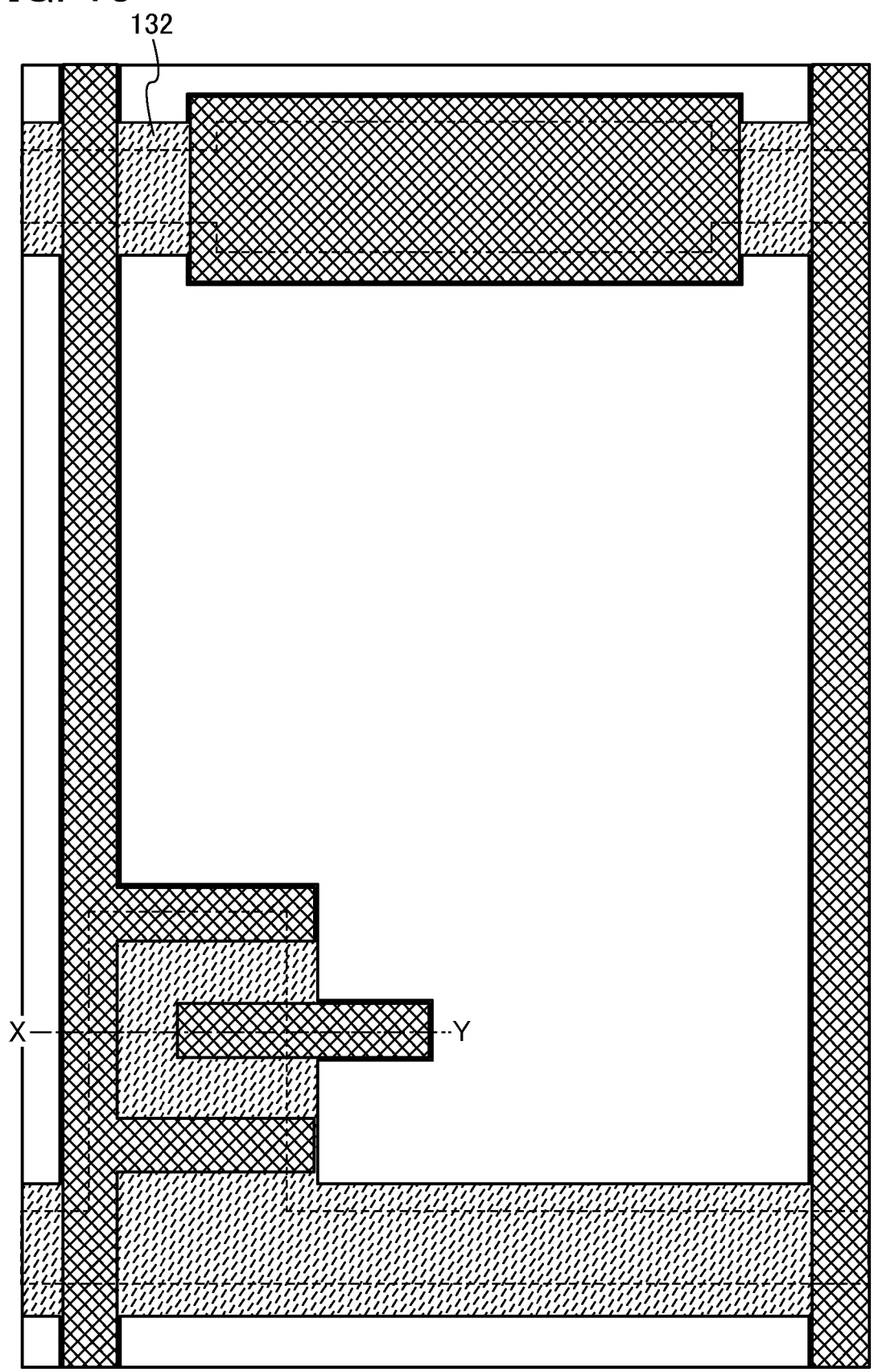
FIG. 13 is a top view illustrating a method for manufacturing a semiconductor device that is one embodiment of the present invention.

Next, the conductive region of the thin film stack body 118 is subjected to dry etching with the use of the second mask layer 128 to form a second electrode layer 130. In this embodiment, this process is referred to as a fourth etching process (FIG. 3C and FIG. 13). Note that through this process, an upper portion of the semiconductor region of the thin film stack body 118, which does not overlap with the second electrode layer 130, is etched to form a semiconductor layer 132.

Here, the fourth etching process may be performed under such conditions that the etching rate of the semiconductor film 108 is low and the etching rate of the second conductive film 110 is high. In other words, the fourth etching process may be performed under such conditions that the etching selectivity of the second conductive film 110 with respect to the semiconductor film 108 is high.

Although not illustrated, the second mask layer 128 may be removed after that. A means by which the semiconductor region of the thin film stack body 118 is not exposed to moisture (e.g., dry etching treatment) is applied to the removal of the second mask layer 128.

In the method for manufacturing a semiconductor device described above, a combination of a material of each of thin films and a gas or an etchant used in an etching process should be considered.

For example, in the case where the semiconductor film 108 is an In—Ga—Zn—O-based oxide semiconductor film, the second conductive film 110 is a Ti film, and the mask film 112 is an aluminum oxide film, a chemical solution in which phosphoric acid, acetic acid, nitric acid, and pure water are mixed (at the volume ratio of 85:5:5:5, for example) may be used as an etchant in the first etching process and the third etching process; a Cl-based gas may be used in the second etching process; and an F-based gas may be used in the fourth etching process. Alternatively, the fourth etching process may be performed by two steps of etching using a Cl-based gas and etching using an F-based gas.

Alternatively, in the case where the semiconductor film 108 is an In—Ga—Zn—O-based oxide semiconductor film, the second conductive film 110 is a Ti film, and the mask film 112 is a silicon oxide film, hydrofluoric acid may be used as an etchant in the first etching process and the third etching process. In this case, a Cl-based gas may be used in the second etching process, and an F-based gas may be used in the fourth etching process. Alternatively, the fourth etching process may be performed by two steps of etching using a Cl-based gas and etching using an F-based gas.

Note that as an example of the Cl-based gas, a $CCl_4$ gas, a $SiCl_4$ gas, a $BCl_3$ gas, or a $Cl_2$ gas can be given. Specifically, a mixed gas of a $BCl_3$ gas and a $Cl_2$ gas is preferably used.

Note that as an example of the F-based gas, a $CF_4$ gas, a $SF_6$ gas, a $NF_3$ gas, a $CBrF_3$ gas, a $CF_3SO_3H$ gas, or a $C_3F_8$ gas can be given. Specifically, a $SF_6$ gas is preferably used.

Note that the sidewall insulating layers 122 may have a stacked structure. In this case, as the inside sidewall insulating layers which are in contact with the side surfaces of the thin film stack body 118, a silicon oxide layer, a silicon oxynitride layer, a silicon nitride oxide layer, or a silicon nitride layer may be formed by a sputtering method or a CVD method (including a plasma CVD method, a thermal CVD method, and the like), and as the outside sidewall insulating layers, a silicon oxide layer, a silicon oxynitride layer, a silicon nitride oxide layer, or a silicon nitride layer may be formed by a sputtering method or a CVD method (including a plasma CVD method, a thermal CVD method, and the like), for example. It is preferable that a silicon oxide layer be formed by a sputtering method as the inside sidewall insulating layers and a silicon nitride layer be formed by a plasma CVD method as the outside sidewall insulating layers, for example, because hydrogen contained in the semiconductor region of the thin film stack body 118 can be reduced and sidewall insulating layers having high barrier properties, which prevents hydrogen and moisture from entering the semiconductor region of the thin film stack body 118, can be formed. Further, in the case where the semiconductor film 108 is an oxide semiconductor film, a portion which is in contact with the oxide semiconductor layer is formed using a silicon oxide layer, so that oxygen can be supplied to the oxide semiconductor layer.

Figure 3D:
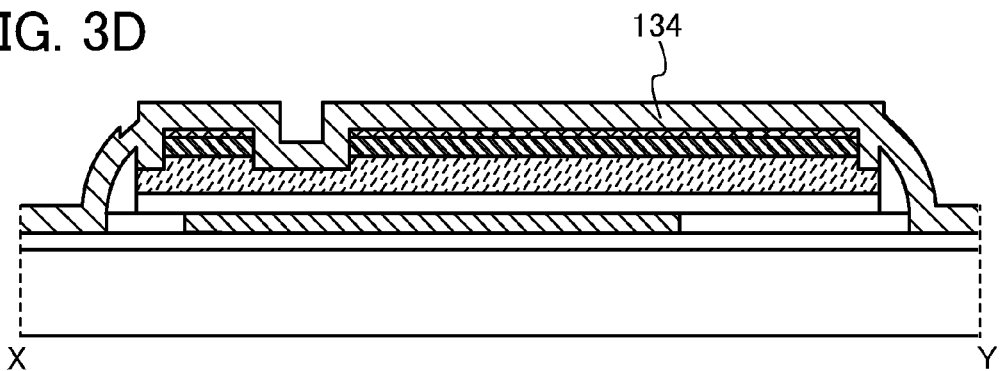

Next, a protective insulating film 134 is formed so as to cover the semiconductor device manufactured in the above manner (FIG. 3D).

The protective insulating film 134 may be formed using an insulating material, like the first insulating film 106. Note that the protective insulating film 134 may have a single-layer structure or a stacked structure including a plurality of layers. Here, the protective insulating film 134 may be formed using silicon nitride or aluminum oxide, for example.

Figure 4A:
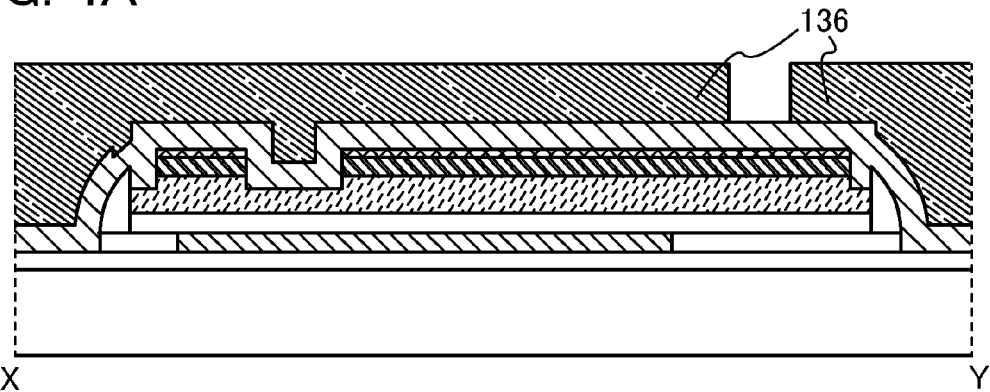
FIGS. 4A to 4D are cross-sectional views illustrating a method for manufacturing a semiconductor device that is one embodiment of the present invention.
Figure 4B:
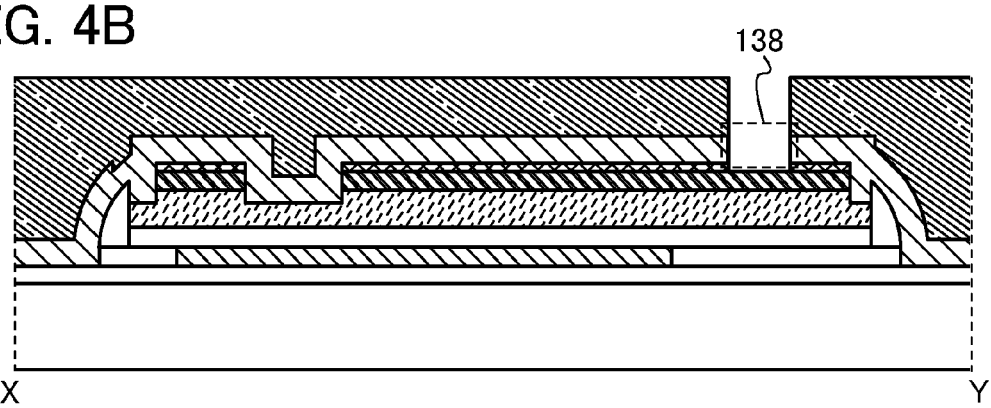
Figure 4C:
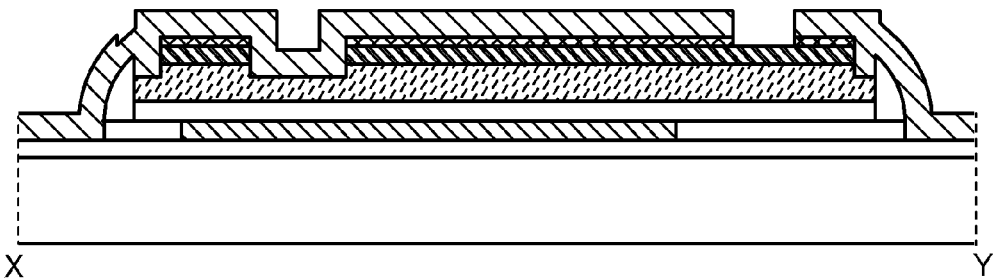

Next, a third resist mask 136 is formed over the protective insulating film 134 (FIG. 4A), and an opening portion 138 is formed in a portion of the protective insulating film 134, which overlaps with the second electrode layer 130 (FIG. 4B). After that, the third resist mask 136 is removed (FIG. 4C). Note that although not illustrated, in the case where the second mask layer 128 is formed using a conductive material, the second mask layer 128 is not necessarily removed in formation of the opening portion 138.

Note that in the case where the second mask layer 128 is removed before formation of the protective insulating film 134, an etching amount can be reduced in formation of the opening portion 138.

Figure 4D:
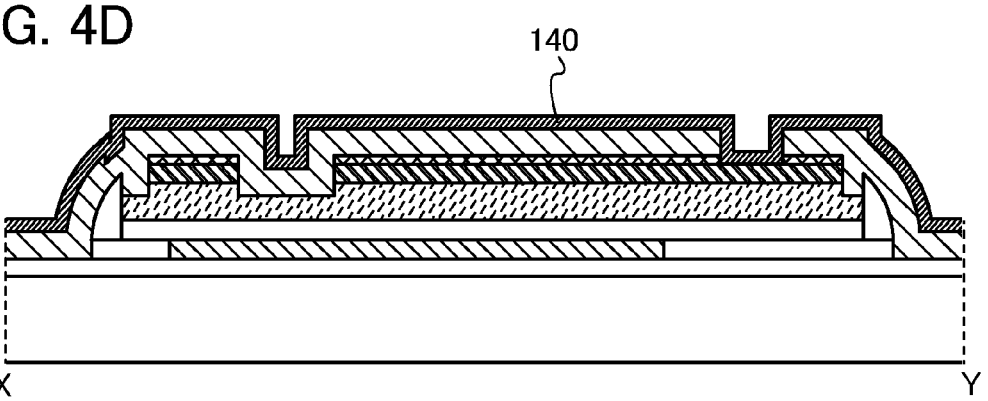
Figure 5A:
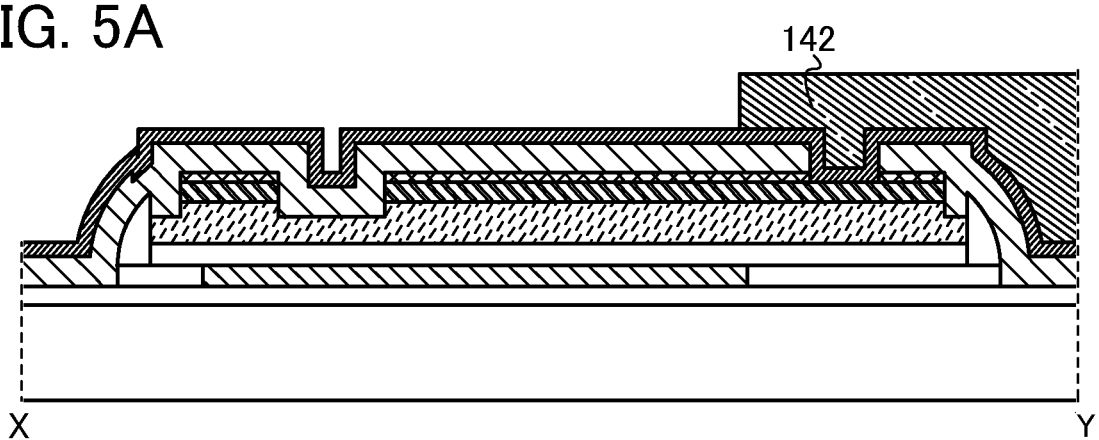
FIGS. 5A to 5C are cross-sectional views illustrating a method for manufacturing a semiconductor device that is one embodiment of the present invention.
Figure 5B:
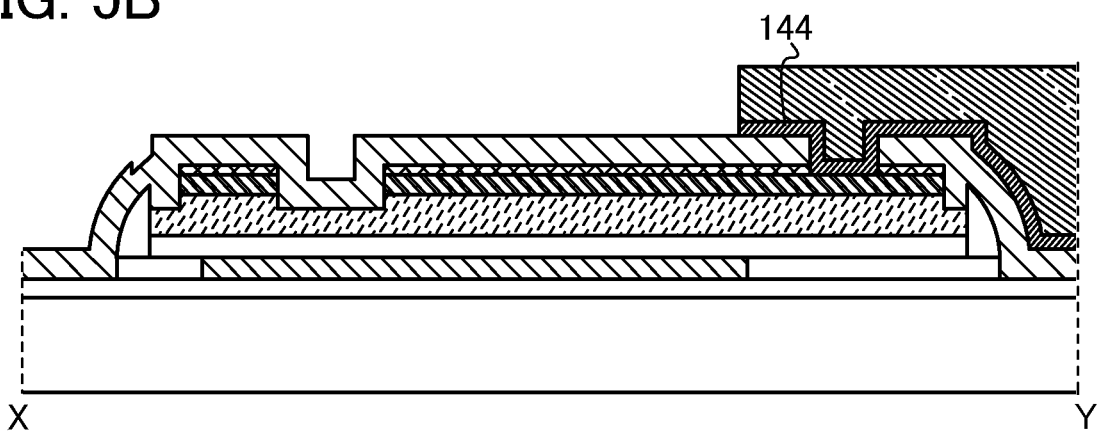
Figure 5C:
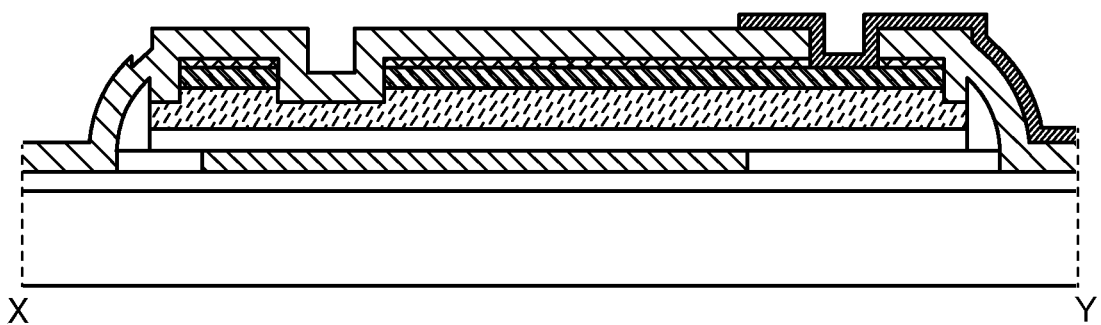
Figure 14:
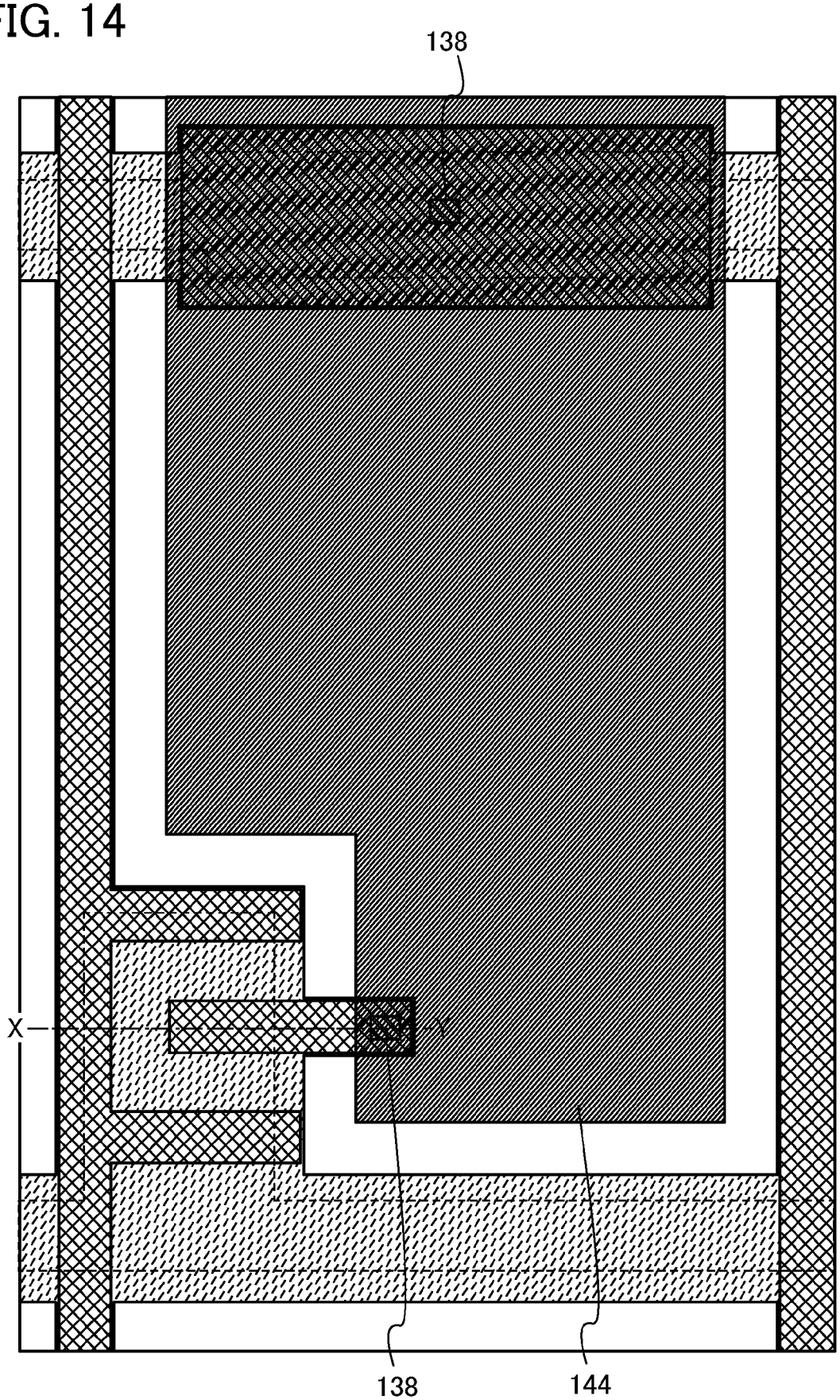
FIG. 14 is a top view illustrating a method for manufacturing a semiconductor device that is one embodiment of the present invention.

Next, a pixel electrode layer 144 is selectively formed over the protective insulating film 134 so as to be connected to the second electrode layer 130 through the opening portion 138 (FIG. 5C). In this embodiment, as an example, a third conductive film 140 is formed over the protective insulating film 134 (FIG. 4D), and a fourth resist mask 142 is formed over the third conductive film 140 (FIG. 5A). Then, the third conductive film 140 is etched to form the pixel electrode layer 144 (FIG. 5B). After that, the fourth resist mask 142 is removed (FIG. 5C and FIG. 14).

Without limitation thereto, the pixel electrode layer 144 may be selectively formed over the protective insulating film 134 by an ink jet method so as to be connected to the second electrode layer 130 through the opening portion 138.

The third conductive film 140 can be a transparent conductive film. The transparent conductive film can be formed using a conductive composition including a conductive high molecule (also referred to as a conductive polymer) having a light-transmitting property. It is preferable that the transparent conductive film formed using the conductive composition have a sheet resistance of less than or equal to 10000 Ω/square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The transparent conductive film can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

As described above, the semiconductor device described in this embodiment can be employed for a pixel transistor of a liquid crystal display device, for example. Note that without limitation thereto, the manufacturing method of this embodiment may be applied to a method for manufacturing an EL display device.

Embodiment 2

Electronic paper can be given as a semiconductor device which is one embodiment of the present invention. Electronic paper can be used for electronic appliances of a variety of fields as long as they can display data. For example, electronic paper can be applied to an electronic book reader (e-book reader), a poster, a digital signage, a public information display (PID), an advertisement in a vehicle such as a train, displays of various cards such as a credit card, and the like. An example of the electronic appliances is illustrated in FIG. 15.

Figure 15:
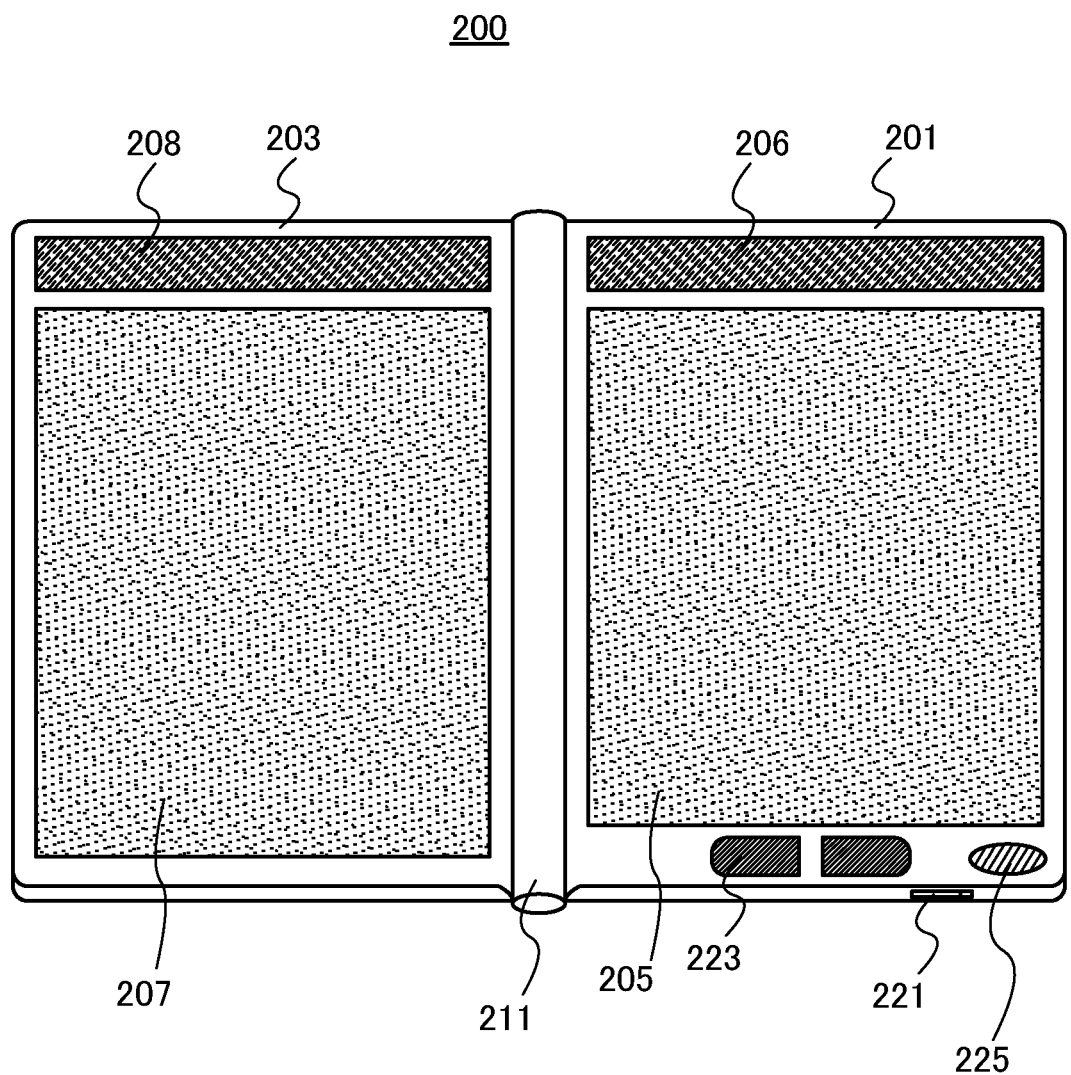
FIG. 15 illustrates a semiconductor device that is one embodiment of the present invention.

FIG. 15 illustrates an example of an e-book reader. For example, an e-book reader 200 includes two housings, a housing 201 and a housing 203. The housing 201 and the housing 203 are combined with a hinge 211 so that the e-book reader 200 can be opened and closed with the hinge 211 as an axis. With such a structure, the e-book reader 200 can be handled like a paper book.

A display portion 205 and a photoelectric conversion device 206 are incorporated in the housing 201. A display portion 207 and a photoelectric conversion device 208 are incorporated in the housing 203. The display portions 205 and 207 may display one image or different images. In the case where the display portions 205 and 207 display different images, for example, a display portion on the right (the display portion 205 in FIG. 15) can display text and a display portion on the left (the display portion 207 in FIG. 15) can display graphics.

Further, in FIG. 15, the housing 201 is provided with an operation portion and the like. For example, the housing 201 is provided with a power switch 221, operation keys 223, a speaker 225, and the like. Pages can be turned with the operation key 223. Note that a keyboard, a pointing device, or the like may also be provided on the surface of the housing, on which the display portion is provided. Further, an external connection terminal (an earphone terminal, a USB terminal, a terminal that can be connected to an AC adapter, various cables such as a USB cable, or the like), a recording medium insertion portion, and the like may be provided on the back surface or the side surface of the housing. Moreover, the e-book reader 200 may have a function of an electronic dictionary.

The e-book reader 200 may be configured to transmit and receive data wirelessly. Through wireless communication, desired book data or the like can be purchased and downloaded from an electronic book server.

The method for manufacturing a semiconductor device described in Embodiment 1 is applied, whereby the semiconductor device of this embodiment can be manufactured in a simple process, in which any surfaces of a portion to be a semiconductor layer provided for the semiconductor device is not exposed to moisture or the like.

Embodiment 3

As a semiconductor device which is one embodiment of the present invention, a variety of electronic appliances (including an amusement machine) can be given in addition to electronic paper. Examples of electronic appliances are a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, a large-sized game machine such as a pachinko machine, and the like.

Figure 16A:
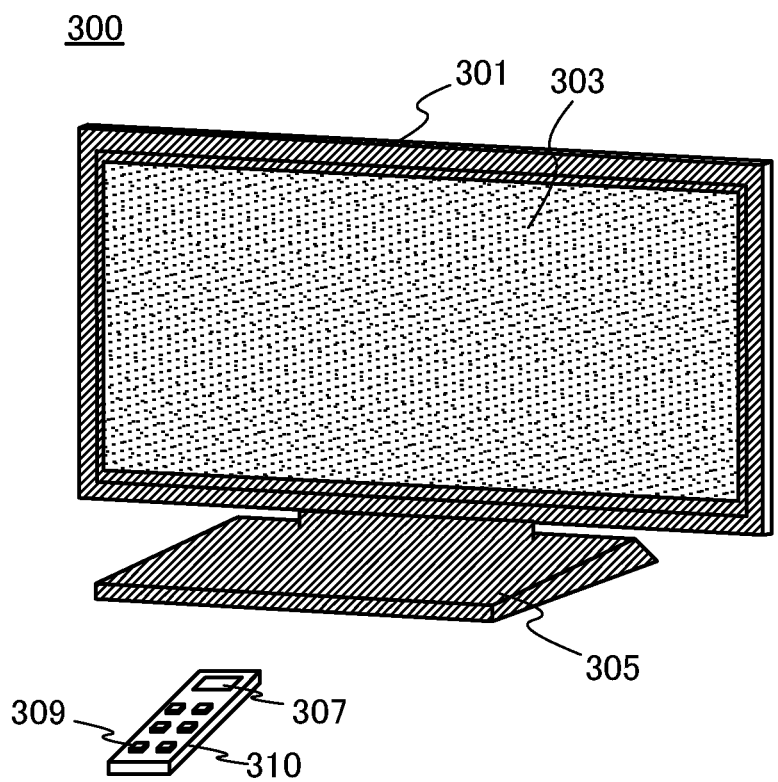
FIGS. 16A and 16B each illustrate a semiconductor device that is one embodiment of the present invention.

FIG. 16A illustrates an example of a television set. A display portion 303 is incorporated in a housing 301 of a television set 300. Images can be displayed on the display portion 303. Here, the housing 301 is supported by a stand 305.

The television set 300 can be operated by an operation switch of the housing 301 or a separate remote controller 310. Channels can be switched and volume can be controlled with operation keys 309 of the remote controller 310, whereby an image displayed on the display portion 303 can be controlled. Moreover, the remote controller 310 may have a display portion 307 in which the information output from the remote controller 310 is displayed.

Note that the television set 300 is provided with a receiver, a modem, and the like. With the use of the receiver, a general television broadcast can be received. Moreover, when the television set 300 is connected to a communication network with or without wires via the modem, one-way (from a sender to a receiver) or two-way (between a sender and a receiver or between receivers) information communication can be performed.

Figure 16B:
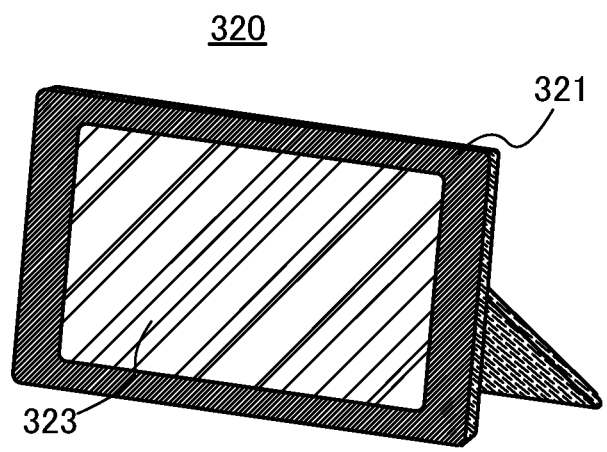

FIG. 16B illustrates an example of a digital photo frame. For example, a display portion 323 is incorporated in a housing 321 of a digital photo frame 320. The display portion 323 can display various images. For example, the display portion 323 can display data of an image shot by a digital camera or the like to function as a normal photo frame.

Note that the digital photo frame 320 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 320. For example, a memory storing data of an image shot by a digital camera is inserted in the recording medium insertion portion of the digital photo frame and the image data is loaded, whereby the image data can be displayed on the display portion 323.

The digital photo frame 320 may be configured to transmit and receive data wirelessly. The structure may be employed in which desired image data is transferred wirelessly to be displayed.

Figure 17:
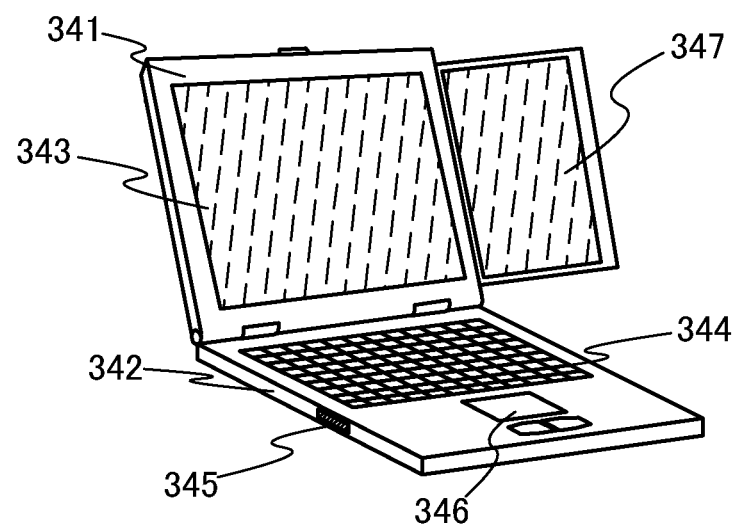
FIG. 17 illustrates a semiconductor device that is one embodiment of the present invention.

FIG. 17 is a perspective view illustrating an example of a portable computer.

In the portable computer of FIG. 17, a top housing 341 having a display portion 343 and a bottom housing 342 having a keyboard 344 can overlap with each other by closing a hinge unit which connects the top housing 341 and the bottom housing 342. Thus, the portable computer is convenient for carrying around. Moreover, in the case of using the keyboard for input, the hinge unit is opened so that a user can input looking at the display portion 343.

The bottom housing 342 includes a pointing device 346 with which input can be performed, in addition to the keyboard 344. Further, when the display portion 343 is a touch input panel, input can be performed by touching part of the display portion. The bottom housing 342 includes an arithmetic function portion such as a CPU or hard disk. In addition, the bottom housing 342 includes an external connection port 345 into which another device such as a communication cable conformable to communication standards of a USB is inserted.

The top housing 341 further includes a display portion 347 which can be stored in the top housing 341 by sliding it toward the inside of the top housing 341. With the display portion 347, a large display screen can be realized. In addition, the user can adjust the orientation of a screen of the storable display portion 347. When the storable display portion 347 is a touch input panel, input can be performed by touching part of the storable display portion.

The display portion 343 or the storable display portion 347 is formed using an image display device such as a liquid crystal display panel or a light-emitting display panel including an organic light-emitting element, an inorganic light-emitting element, or the like.

In addition, the portable computer illustrated in FIG. 17 can be provided with a receiver and the like and can receive a television broadcast to display an image on the display portion. While the hinge unit which connects the top housing 341 and the bottom housing 342 is kept closed, the whole screen of the display portion 347 is exposed by sliding the display portion 347 out and the angle of the screen is adjusted; thus, the user can watch a television broadcast. In this case, the hinge unit is not opened and display is not performed on the display portion 343. In addition, start up of only a circuit for displaying a television broadcast is performed. Therefore, power can be consumed to the minimum, which is advantageous for the portable computer whose battery capacity is limited.

The method for manufacturing a semiconductor device described in Embodiment 1 is applied, whereby the semiconductor device of this embodiment can be manufactured in a simple process, in which the any surfaces of a portion to be a semiconductor layer provided for the semiconductor device is not exposed to moisture or the like.

This application is based on Japanese Patent Application Ser. No. 2010-231372 filed with Japan Patent Office on Oct. 14, 2010, the entire contents of which are hereby incorporated by reference.

What is claimed is:

1. A method for manufacturing a semiconductor device, comprising the steps of:
   forming a first conductive film over a substrate;
   forming a first insulating film over the first conductive film;
   forming a semiconductor film over the first insulating film;
   forming a second conductive film over the semiconductor film;
   forming a mask film over the second conductive film;
   forming a first resist mask over the mask film;
   forming a first mask layer by performing dry etching or wet etching on the mask film with the first resist mask;
   removing the first resist mask using a resist stripper;
   forming a thin film stack body by performing dry etching on the first insulating film, the semiconductor film, and the second conductive film with the first mask layer, so that at least a surface of the first conductive film is exposed;
   forming a second insulating film over the first mask layer and the thin film stack body;
   etching the second insulating film to form a sidewall insulating layer covering a side surface of the thin film stack body;
   forming a first electrode layer by performing wet etching or dry etching on a side portion of the first conductive film with the first mask layer and the sidewall insulating layer after etching the second insulating film;
   forming a second resist mask over the first mask layer after forming the first electrode layer;
   forming a second mask layer by performing dry etching or wet etching on the first mask layer with the second resist mask after forming the second resist mask;
   removing the second resist mask using a resist stripper after forming the second mask layer; and
   forming a second electrode layer and a semiconductor layer by performing dry etching on an upper portion of the thin film stack body with the second mask layer and the sidewall insulating layer after removing the second resist mask.

2. The method for manufacturing a semiconductor device according to claim 1, further comprising the steps of:
   forming a pixel electrode layer over the second electrode layer,
   wherein the pixel electrode layer is connected to the second electrode layer.

3. The method for manufacturing a semiconductor device according to claim 1, further comprising the steps of:
   forming a protective insulating film over the second electrode layer;
   forming an opening portion in the protective insulating film so as to expose the second electrode layer; and
   forming a pixel electrode layer over the protective insulating film and the opening portion in the protective insulating film,
   wherein the pixel electrode layer is connected to the second electrode layer through the opening portion of the protective insulating film.

4. The method for manufacturing a semiconductor device according to claim 1,
   wherein the semiconductor film is an In—Ga—Zn—O-based oxide semiconductor film,
   wherein the first conductive film and the second conductive film each is a titanium film, and
   wherein the mask film is an aluminum oxide film.

5. A method for manufacturing a semiconductor device, comprising the steps of:
   forming a first conductive film over a substrate;
   forming a first insulating film over the first conductive film;
   forming a semiconductor film over the first insulating film;
   forming a second conductive film over the semiconductor film;
   forming a mask film over the second conductive film;
   forming a first resist mask over the mask film;
   forming a first mask layer by performing dry etching or wet etching on the mask film with the first resist mask;
   removing the first resist mask using a resist stripper;

forming a thin film stack body by performing dry etching on the first insulating film, the semiconductor film, and the second conductive film with the first mask layer, so that at least a surface of the first conductive film is exposed;

forming a second insulating film over the first mask layer and the thin film stack body;

etching the second insulating film to form a sidewall insulating layer covering a side surface of the thin film stack body;

forming a second resist mask over the first mask layer after etching the second insulating film;

forming a first electrode layer by performing wet etching or dry etching on a side portion of the first conductive film with the first mask layer and the sidewall insulating layer after forming the second resist mask;

forming a second mask layer by performing dry etching or wet etching on the first mask layer with the second resist mask after forming the first electrode layer;

removing the second resist mask using a resist stripper after forming the second mask layer; and forming a second electrode layer and a semiconductor layer by performing dry etching on an upper portion of the thin film stack body with the second mask layer and the sidewall insulating layer after removing the second resist mask.

6. The method for manufacturing a semiconductor device according to claim 5, further comprising the steps of:
forming a pixel electrode layer over the second electrode layer,
wherein the pixel electrode layer is connected to the second electrode layer.

7. The method for manufacturing a semiconductor device according to claim 5, further comprising the steps of:
forming a protective insulating film over the second electrode layer;
forming an opening portion in the protective insulating film so as to expose the second electrode layer; and
forming a pixel electrode layer over the protective insulating film and the opening portion in the protective insulating film,
wherein the pixel electrode layer is connected to the second electrode layer through the opening portion of the protective insulating film.

8. The method for manufacturing a semiconductor device according to claim 5,
wherein the semiconductor film is an In—Ga—Zn—O-based oxide semiconductor film,
wherein the first conductive film and the second conductive film each is a titanium film, and
wherein the mask film is an aluminum oxide film.

9. A method for manufacturing a semiconductor device, comprising the steps of:
forming a first conductive film over a substrate;
forming a first insulating film over the first conductive film;
forming a semiconductor film over the first insulating film;
forming a second conductive film over the semiconductor film;
forming a mask film over the second conductive film;
forming a first resist mask over the mask film;
forming a first mask layer by performing dry etching or wet etching on the mask film with the first resist mask;
removing the first resist mask using a resist stripper;
forming a thin film stack body by performing dry etching on the first insulating film, the semiconductor film, and the second conductive film with the first mask layer, so that at least a surface of the first conductive film is exposed;

forming a second insulating film over the first mask layer and the thin film stack body;

etching the second insulating film to form a sidewall insulating layer covering a side surface of the thin film stack body;

forming a second resist mask over the first mask layer after etching the second insulating film;

forming a second mask layer by performing dry etching or wet etching on the first mask layer with the second resist mask after forming the second resist mask;

forming a first electrode layer by performing wet etching or dry etching on a side portion of the first conductive film with the first mask layer and the sidewall insulating layer after forming the second mask layer;

removing the second resist mask using a resist stripper after forming the first electrode layer; and forming a second electrode layer and a semiconductor layer by performing dry etching on an upper portion of the thin film stack body with the second mask layer and the sidewall insulating layer after removing the second resist mask.

10. The method for manufacturing a semiconductor device according to claim 9, further comprising the steps of:
forming a pixel electrode layer over the second electrode layer,
wherein the pixel electrode layer is connected to the second electrode layer.

11. The method for manufacturing a semiconductor device according to claim 9, further comprising the steps of:
forming a protective insulating film over the second electrode layer;
forming an opening portion in the protective insulating film so as to expose the second electrode layer; and
forming a pixel electrode layer over the protective insulating film and the opening portion in the protective insulating film,
wherein the pixel electrode layer is connected to the second electrode layer through the opening portion of the protective insulating film.

12. The method for manufacturing a semiconductor device according to claim 9,
wherein the semiconductor film is an In—Ga—Zn—O-based oxide semiconductor film,
wherein the first conductive film and the second conductive film each is a titanium film, and
wherein the mask film is an aluminum oxide film.

13. A method for manufacturing a semiconductor device, comprising the steps of:
forming a first conductive film over a substrate;
forming a first insulating film over the first conductive film;
forming a semiconductor film over the first insulating film;
forming a second conductive film over the semiconductor film;
forming a mask film over the second conductive film;
forming a first resist mask over the mask film;
forming a first mask layer by performing dry etching or wet etching on the mask film with the first resist mask;
removing the first resist mask using a resist stripper;
forming a thin film stack body by performing dry etching on the first insulating film, the semiconductor film, and the second conductive film with the first mask layer, so that at least a surface of the first conductive film is exposed;

forming a second insulating film over the first mask layer and the thin film stack body;

etching the second insulating film to form a sidewall insulating layer covering a side surface of the thin film stack body;

forming a second resist mask over the first mask layer after etching the second insulating layer;

forming a second mask layer by performing dry etching or wet etching on the first mask layer with the second resist mask after forming the second resist mask;

removing the second resist mask using a resist stripper after forming the second mask layer;

forming a first electrode layer by performing wet etching or dry etching on a side portion of the first conductive film with the second mask layer and the sidewall insulating layer; and forming a second electrode layer and a semiconductor layer by performing dry etching on an upper portion of the thin film stack body with the second mask layer and the sidewall insulating layer after forming the first electrode layer.

14. The method for manufacturing a semiconductor device according to claim 13, further comprising the steps of:

forming a pixel electrode layer over the second electrode layer, wherein the pixel electrode layer is connected to the second electrode layer.

15. The method for manufacturing a semiconductor device according to claim 13, further comprising the steps of:

forming a protective insulating film over the second electrode layer;

forming an opening portion in the protective insulating film so as to expose the second electrode layer; and forming a pixel electrode layer over the protective insulating film and the opening portion in the protective insulating film, wherein the pixel electrode layer is connected to the second electrode layer through the opening portion of the protective insulating film.

16. The method for manufacturing a semiconductor device according to claim 13, wherein the semiconductor film is an In—Ga—Zn—O-based oxide semiconductor film, wherein the first conductive film and the second conductive film each is a titanium film, and wherein the mask film is an aluminum oxide film.

* * * * *